(12) United States Patent
Ho et al.

(10) Patent No.: US 11,264,277 B2
(45) Date of Patent: Mar. 1, 2022

(54) SEMICONDUCTOR DEVICE WITH SPACERS FOR SELF ALIGNED VIAS

(71) Applicant: TAIWAN SEMICONDUCTOR MANUFACTURING COMPANY LIMITED, Hsin-Chu (TW)

(72) Inventors: Pokuan Ho, Taipei (TW); Hsin-Ping Chen, Hsinchu County (TW); Chia-Tien Wu, Taichung (TW)

(73) Assignee: TAIWAN SEMICONDUCTOR MANUFACTURING COMPANY LIMITED, Hsin-Chu (TW)

( * ) Notice: Subject to any disclaimer, the term of this patent is extended or adjusted under 35 U.S.C. 154(b) by 0 days.

(21) Appl. No.: 16/669,917

(22) Filed: Oct. 31, 2019

(65) Prior Publication Data
US 2021/0134672 A1 May 6, 2021

(51) Int. Cl.
*H01L 21/768* (2006.01)
*H01L 23/522* (2006.01)

(52) U.S. Cl.
CPC .... *H01L 21/76897* (2013.01); *H01L 21/7681* (2013.01); *H01L 21/76834* (2013.01); *H01L 21/76847* (2013.01); *H01L 23/5226* (2013.01); *H01L 2221/1026* (2013.01); *H01L 2224/05006* (2013.01)

(58) Field of Classification Search
CPC ............... H01L 23/5226; H01L 2224/05006
See application file for complete search history.

(56) References Cited

U.S. PATENT DOCUMENTS

2015/0364371 A1* 12/2015 Yen ................. H01L 21/823475
 257/401
2016/0118334 A1* 4/2016 Tsai .................. H01L 21/76885
 257/773
2018/0294184 A1* 10/2018 Koh ................ H01L 21/823475

\* cited by examiner

*Primary Examiner* — Jay C Chang
*Assistant Examiner* — Mikka Liu
(74) *Attorney, Agent, or Firm* — Cooper Legal Group, LLC

(57) ABSTRACT

A semiconductor device includes a first conductive structure. The semiconductor device includes a first dielectric structure. The semiconductor device includes a second conductive structure. The first dielectric structure is positioned between a first surface of the first conductive structure and a surface of the second conductive structure. The semiconductor device includes an etch stop layer overlaying the first conductive structure. The semiconductor device includes a first spacer structure overlaying the first dielectric structure. The semiconductor device includes a second dielectric structure overlaying the first spacer structure and the etch stop layer.

20 Claims, 20 Drawing Sheets

SEMICONDUCTOR DEVICE WITH SPACERS FOR SELF ALIGNED VIAS

BACKGROUND

A semiconductor device comprises, among other things, conductive structures, such as vias and metal lines, that connect together components of the semiconductor device, such as transistors, capacitors, etc. of the semiconductor device. Due to imprecisions in the manufacturing process, such as overlay shift, two conductive structures can become misaligned such that a first conductive structure does not fully contact a second conductive structure. Misalignment can cause a conductive structure to be too close to a neighboring conductive structure, which can result in leakage currents. Moreover, the misalignment may result in increased resistance being introduced into the semiconductor device. As a result, misalignment can reduce yield and reliability of semiconductor devices.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
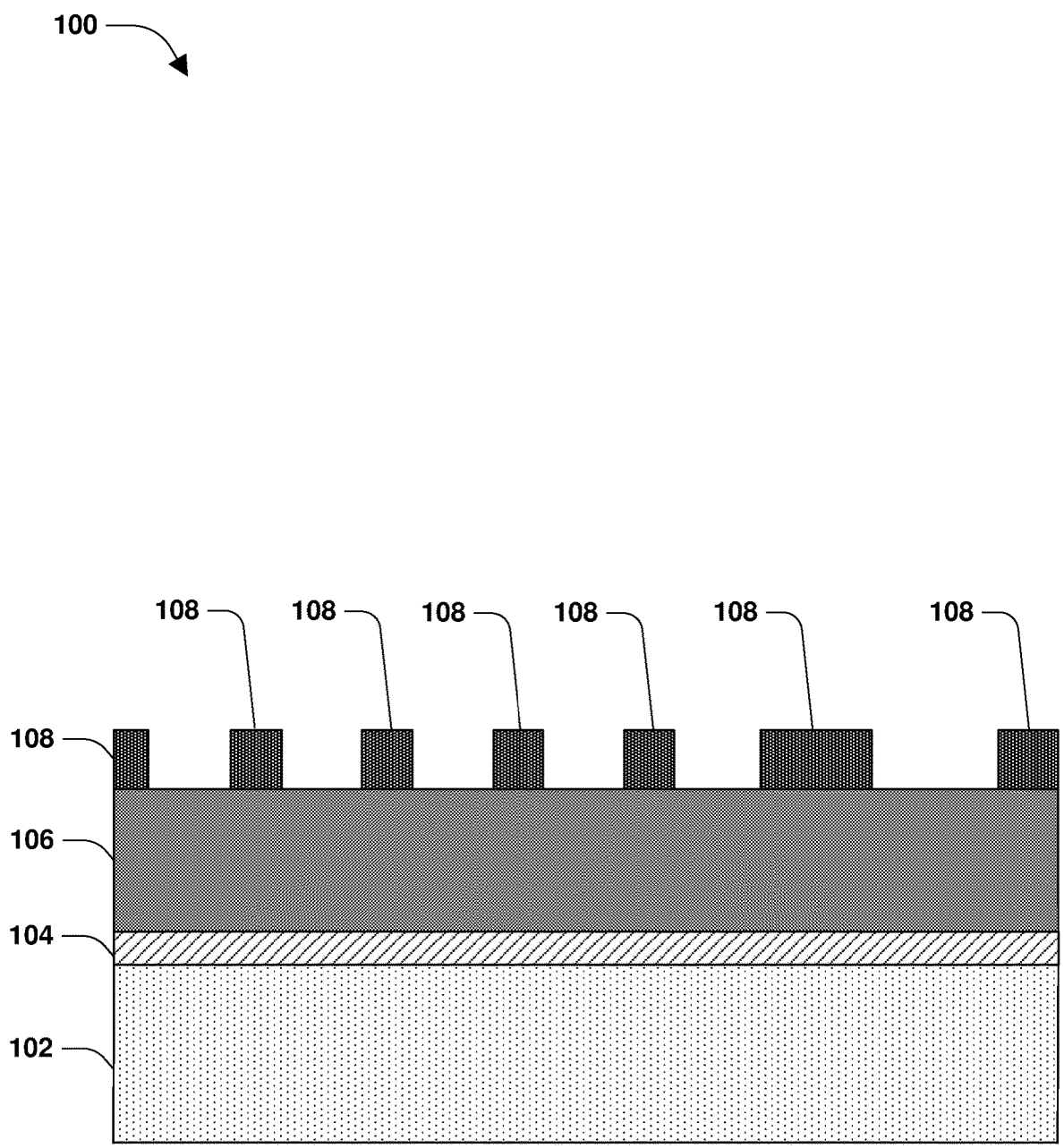
FIGS. 1, 2, 3A-3D, 4-8, 9A, and 9B are illustrations of cross-sectional views of a semiconductor device at various stages of fabrication, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In some embodiments, a semiconductor device comprising a plurality of spacer structures for aligning a conductive structure, such as a via, with another, underlying conductive structure are provided. In some embodiments, the spacer structures are formed on opposing sides of the underlying conductive structure. In some embodiments, a dielectric layer is formed over the spacer structures and over a first recess defined by, among other things, sidewalls of the spacer structures and a top surface of the underlying conductive structure. In some embodiments, when the dielectric layer is etched to form a second recess into which the conductive structure is to be formed, etching of the spacer structures and layers underlying the spacer structures is mitigated due to an etch selectivity of the spacer structures relative to the dielectric layer. As such, in some embodiments, the second recess is aligned with the underlying conductive structure, which is disposed between the spacer structures. Thus, in some embodiments, the spacer structures confine an area in which the second recess is formed and thereby provide or help control alignment of the conductive structure formed in the second recess relative to the underlying conductive structure. In some embodiments, the spacer structures are used to provide confinement for forming self-aligned vias integrated with a back end of line damascene process. The methods and subsequent formations disclosed herein may be used for form conductive structures, or vias, for contacting contacts disposed in an $M_1$ layer to an $M_x$ of a semiconductor device, where x is an integer greater than 1.

Figure 8:
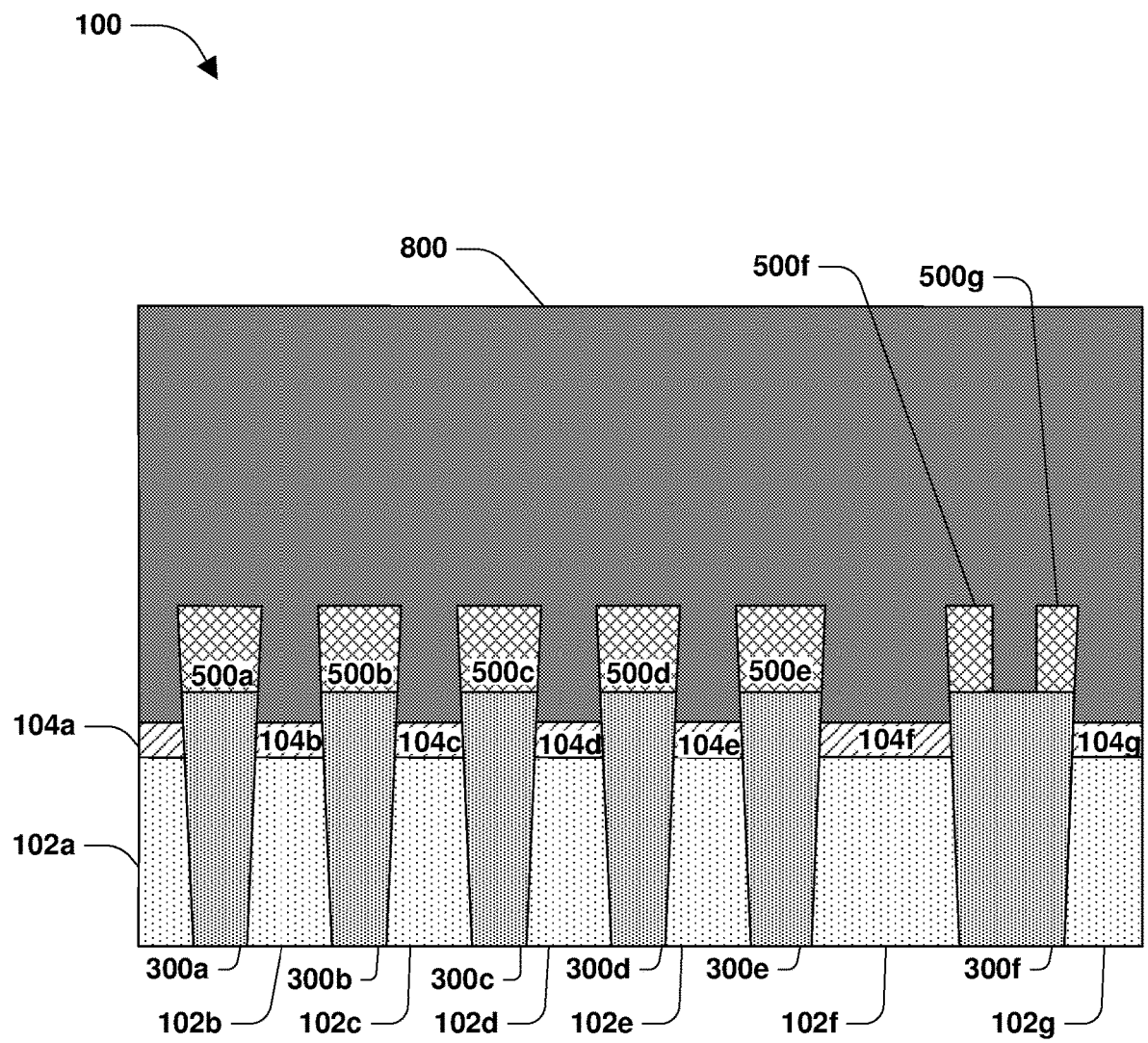
Figure 9A:
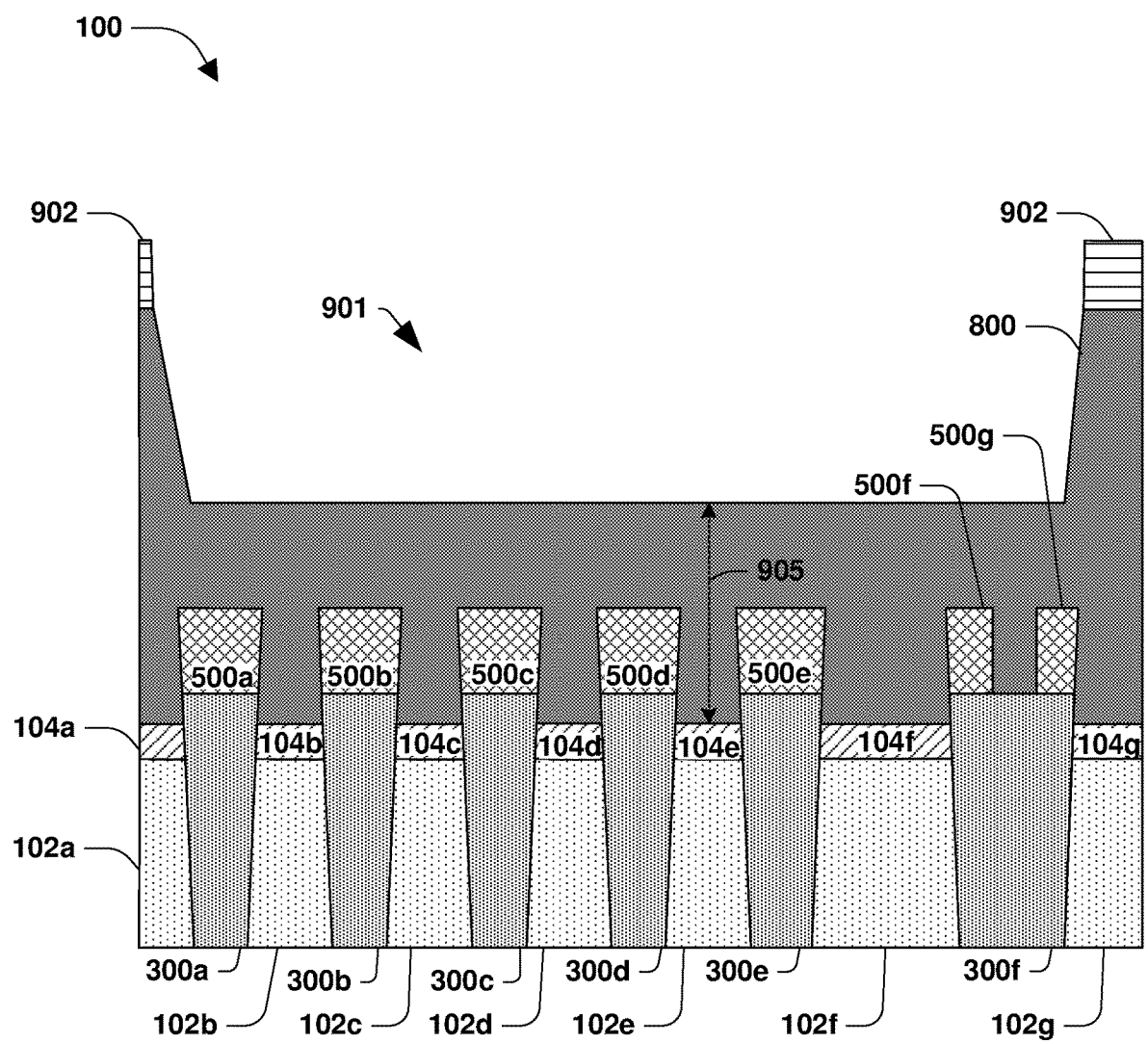
Figure 9B:
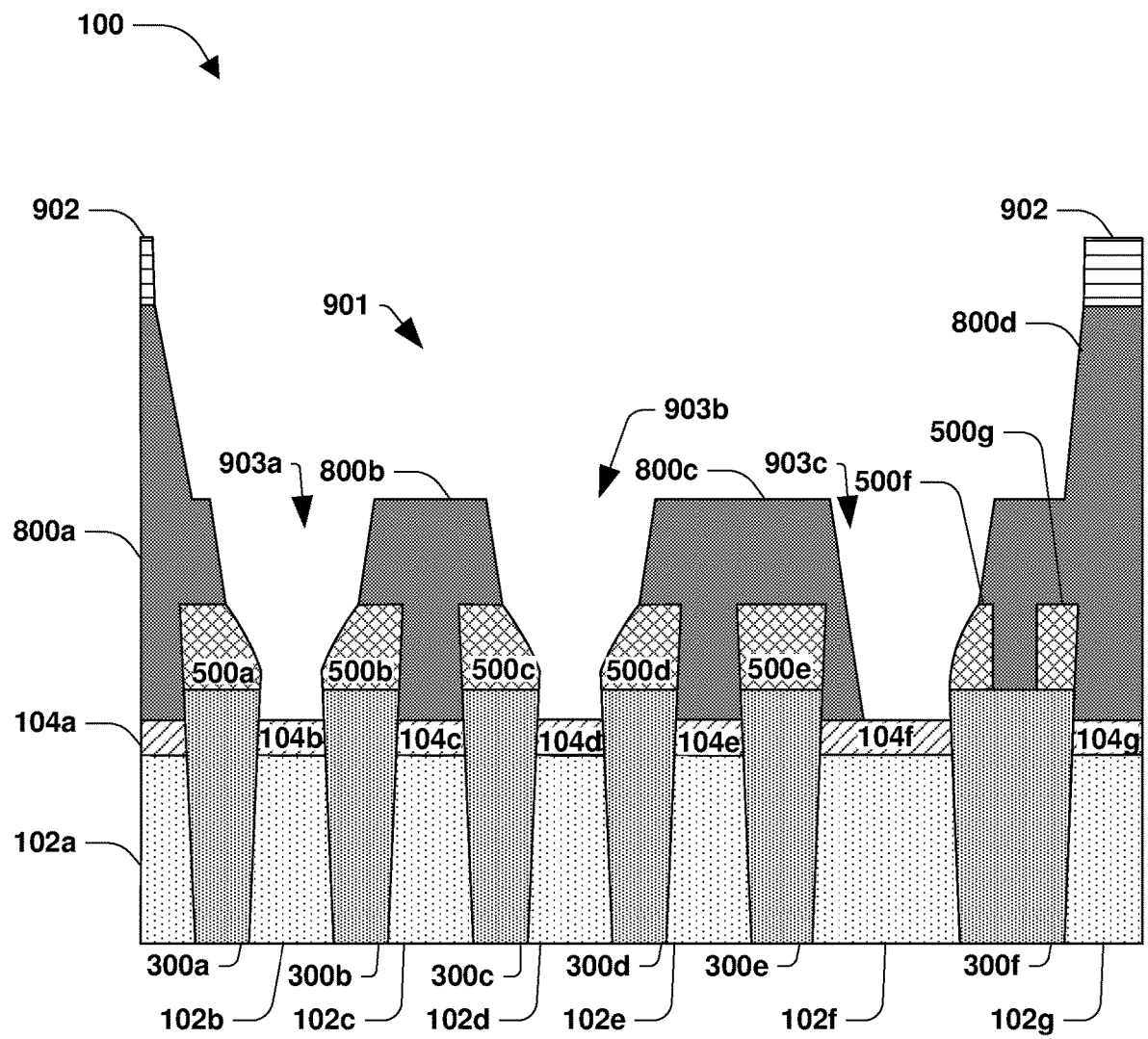
Figure 9C:
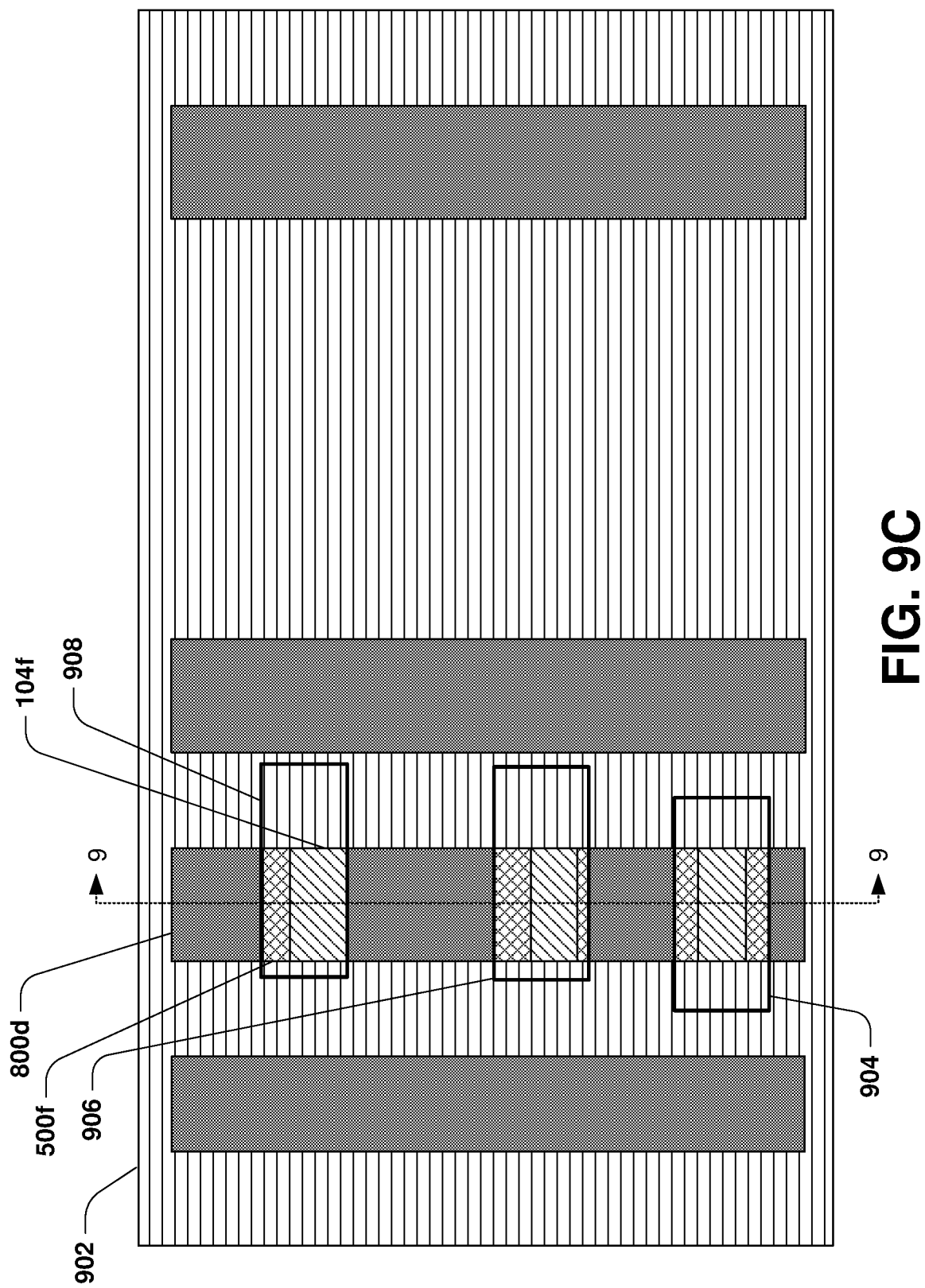
FIGS. 9C and 9D are is illustrations of top-down views of a semiconductor device, in accordance with some embodiments.
Figure 9D:
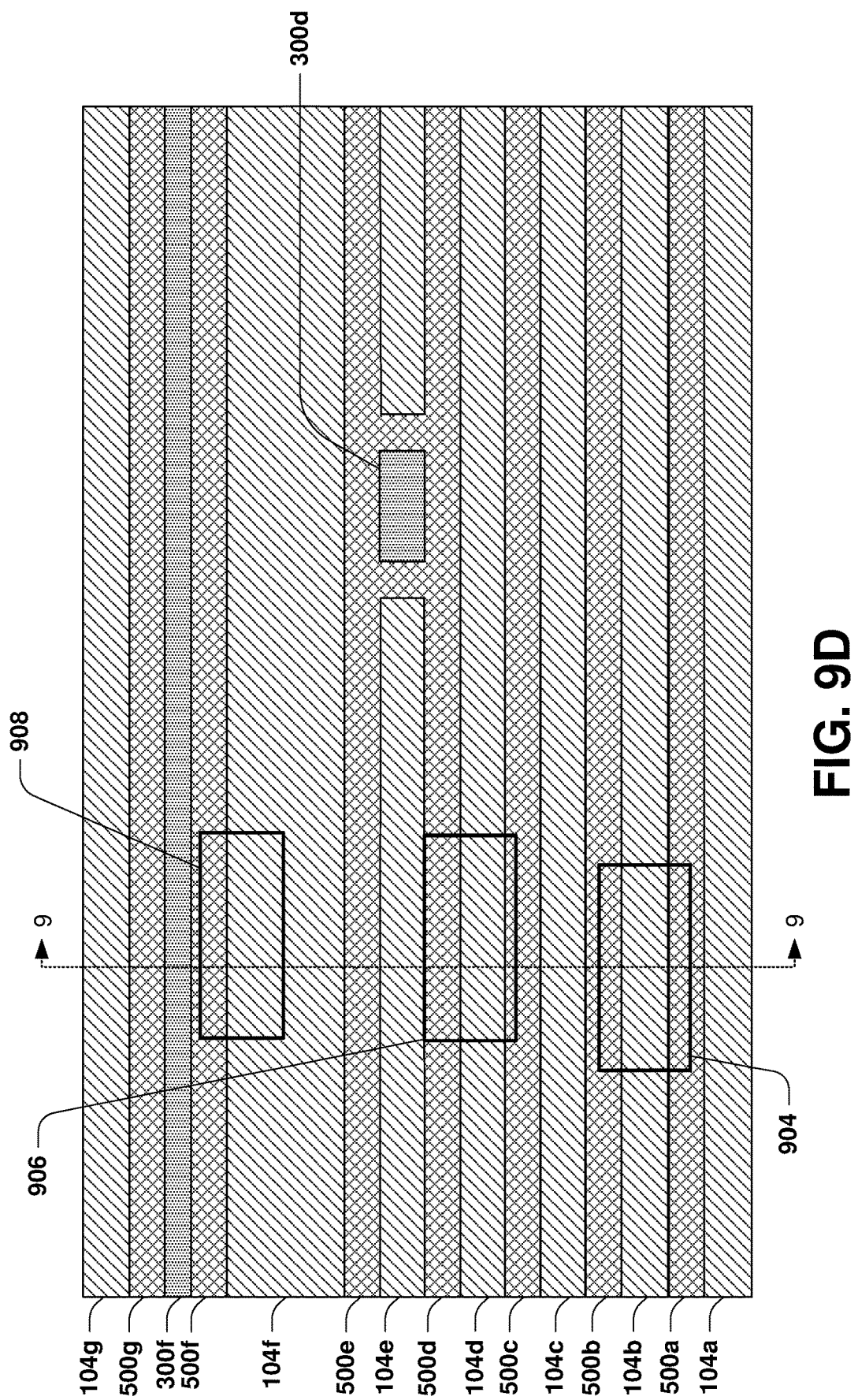

FIGS. 1, 2, 3A-3D, 4-8, 9A, 9B, 10, and 11 are cross-sectional views of a semiconductor device 100 formed with spacer structures 500a-500g and FIGS. 9C and 9D are top-down views of the semiconductor device 100 formed with the spacer structures 500a-500g, in accordance with some embodiments.

Referring to FIG. 1, a first conductive layer 102 is formed, according to some embodiments. In some embodiments, the first conductive layer 102 is formed by a deposition process, such as chemical vapor deposition (CVD), physical vapor deposition (PVD), low pressure CVD (LPCVD), plasma enhanced chemical vapor deposition (PECVD), atomic layer CVD (ALCVD), atomic layer deposition (ALD), a spin-on technology, or other suitable deposition process. In some embodiments, the first conductive layer 102 is a metal layer from which metal contacts are to be formed. In some embodiments, the first conductive layer 102 comprises Cu, Ru, W, Ti, Al, Co, Mo, Ir, Rh, or other suitable material. Although not illustrated, in some embodiments, one or more layers or elements of a semiconductor device may be provided below the first conductive layer 102, such as a semiconductor substrate, source/drain regions of transistors, gate structures of transistors, capacitors, resistive elements, etc.

In some embodiments, an etch stop layer 104 is formed over the first conductive layer 102. In some embodiments, the etch stop layer 104 is formed by a deposition process, such as CVD, PVD, LPCVD, PECVD, ALCVD, ALD, a spin-on technology, or other suitable deposition process. In some embodiments, the etch stop layer 104 overlies the first conductive layer 102. In some embodiments, the etch stop layer 104 contacts the first conductive layer 102. In some embodiments, the etch stop layer 104 comprises SiCN, $SiO_2$, $SiN_x$, $AlO_xN_y$, Ru, W, Ti, Al, Co, CoWP, a metal oxide, such as $AlO_x$, or other suitable material, where x and y are integers greater than or equal to 1. In some embodiments, the etch stop layer 104 has a height between about 1 angstrom and about 200 angstrom. In some embodiments, the etch stop layer 104 comprises a single layer of material. In some embodiments, the etch stop layer 104 comprises multiple layers of material. For example, the etch stop layer 104 may comprise a layer of SiCN, a layer of $SiO_2$, and a layer of Ti. In some embodiments, a thickness of each layer is between about 3 angstroms and about 200 angstroms.

In some embodiments, a sacrificial material layer 106 is formed over the etch stop layer 104. In some embodiments, the sacrificial material layer 106 is formed by a deposition process, such as CVD, PVD, LPCVD, PECVD, ALCVD, ALD, a spin-on technology, or other suitable deposition process. In some embodiments, the sacrificial material layer 106 overlies the etch stop layer 104. In some embodiments, the sacrificial material layer 106 contacts the etch stop layer 104. In some embodiments, the sacrificial material layer 106 comprises SiCN, $SiO_2$, $SiN_x$, $AlO_xN_y$, TiN, a metal oxide, such as $AlO_x$, or other suitable material, where x and y are integers greater than or equal to 1. In some embodiments, the sacrificial material layer 106 comprises a hard mask material, such as nitride, oxide, silicon, or other suitable material.

In some embodiments, a hard mask 108 is formed over the sacrificial material layer 106. In some embodiments, the hard mask 108 comprises at least one of oxide, nitride, silicon, or other suitable material. In some embodiments, the hard mask 108 is formed by a deposition process, such as CVD, PVD, LPCVD, PECVD, ALCVD, ALD, a spin-on technology, or other suitable deposition process. In some embodiments, the hard mask 108 overlies the sacrificial material layer 106. In some embodiments, the hard mask 108 contacts the sacrificial material layer 106. In some embodiments, the sacrificial material layer 106 is omitted, and the hard mask 108 is used in place of sacrificial material layer 106. Thus, in some embodiments, the hard mask 108 may contact the etch stop layer 104. In some embodiments, where the sacrificial material layer 106 comprises a hard mask material, a material of the hard mask 108 is selected to have a different etch selectivity than the hard mask material of the sacrificial material layer 106 to enable the sacrificial material layer 106 to be etched at a different time than the hard mask 108, as described with respect to FIGS. 4 and 7.

In some embodiments, the hard mask 108 is formed by forming a layer of hard mask material over the sacrificial material layer 106 or over the etch stop layer 104 and patterning the layer of hard mask material to define the hard mask 108, which covers some portions of the sacrificial material layer 106, the etch stop layer 104, and the first conductive layer 102, while other portions of the sacrificial material layer 106, the etch stop layer 104, and the first conductive layer 102 are uncovered or are exposed. In some embodiments, the hard mask 108 defines openings through which a subsequent etch process is performed to create recesses through at least one of the sacrificial material layer 106, the etch stop layer 104, or the first conductive layer 102.

Figure 2:
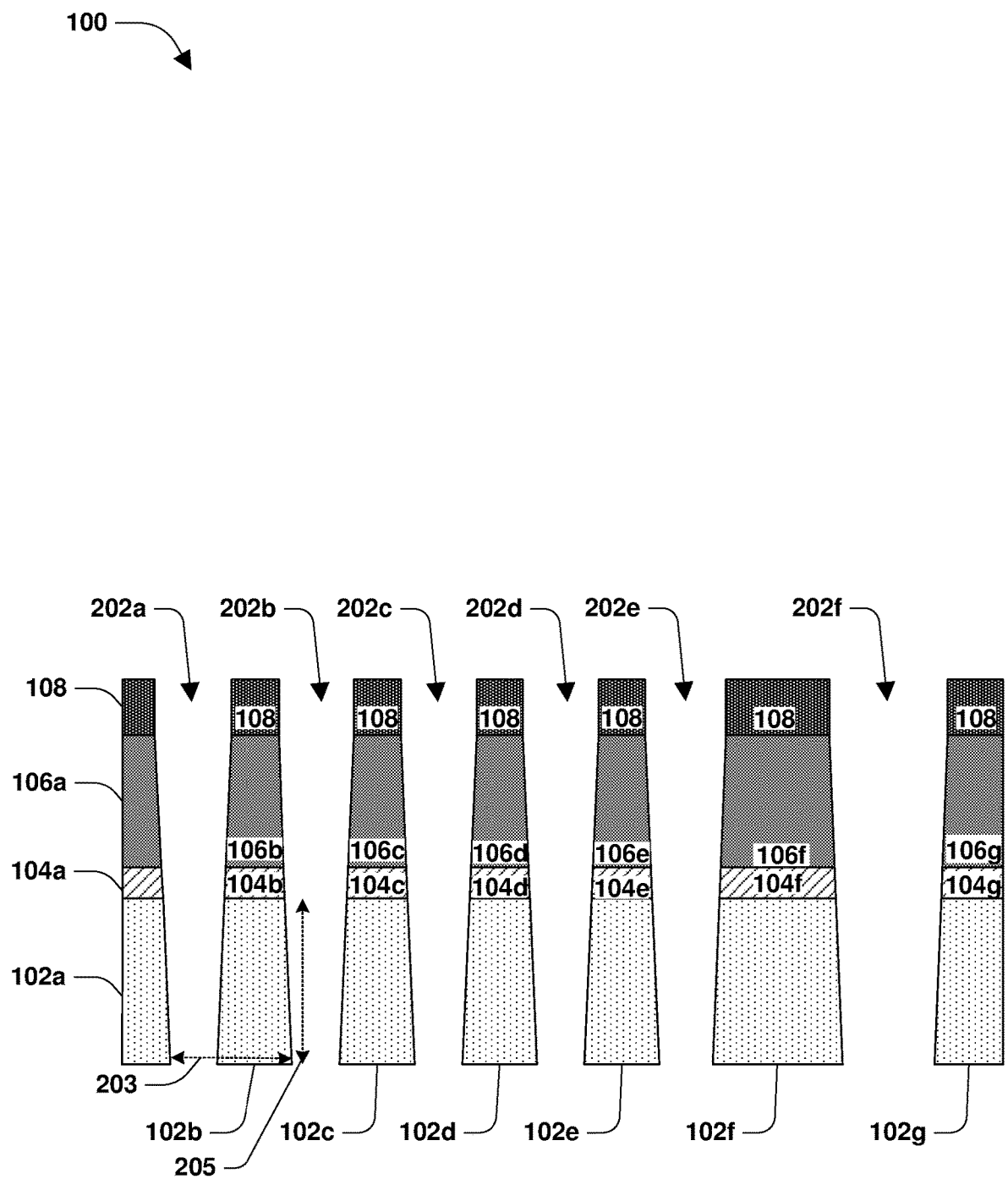

Referring to FIG. 2, portions of the sacrificial material layer 106, the etch stop layer 104, and the first conductive layer 102 are removed, in accordance with some embodiments. In some embodiments, removing the portions of the sacrificial material layer 106, the etch stop layer 104, and the first conductive layer 102 results in first conductive structures 102a-102g, etch stop layer structures 104a-104g, and sacrificial material structures 106a-106g, respectively, being formed. In some embodiments, the portions of the sacrificial material layer 106, the etch stop layer 104, and the first conductive layer 102 are removed by an etch process to define recesses 202a-202f. In some embodiments, the etch process does not remove material of the sacrificial material layer 106, the etch stop layer 104, and the first conductive layer 102 that form the first conductive structures 102a-102g, the etch stop layer structures 104a-104g, and the sacrificial material structures 106a-106g because the hard mask 108 protects such material from being etched away or removed by the etch process. In some embodiments, the etch process comprises a single damascene etch process. In some embodiments, the etch process comprises a dual damascene etch process. In some embodiments, the etch process comprises a metal etch process. In some embodiments, depending upon the material compositions and the etch selectivities of the sacrificial material layer 106, the etch stop layer 104, and the first conductive layer 102, the etch process may be performed in a single stage or in multiple stages using at least one of different etch chemistries or different etching methodologies to remove the portions of the sacrificial material layer 106, the etch stop layer 104, and the first conductive layer 102.

In some embodiments, the portions of the sacrificial material layer 106, the etch stop layer 104, and the first conductive layer 102 are selectively removed to maintain pitches of about 14 nm to about 42 nm or more between the first conductive structures 102a-102g. For example, a pitch 203 between a conductive structure 102a and a conductive structure 102b of the first conductive structures 102a-102g may be between about 14 nm and about 42 nm. In some embodiments, after the removal of the portions of the sacrificial material layer 106, the etch stop layer 104, and the first conductive layer 102, a ratio of heights of the first conductive structures 102a-102g, such as a height 205 of the conductive structure 102b, to pitches between the first conductive structures 102a-102g, such as the pitch 203 between the conductive structure 102a and the conductive structure 102b, is between about 1 and 4.

Figure 3A:
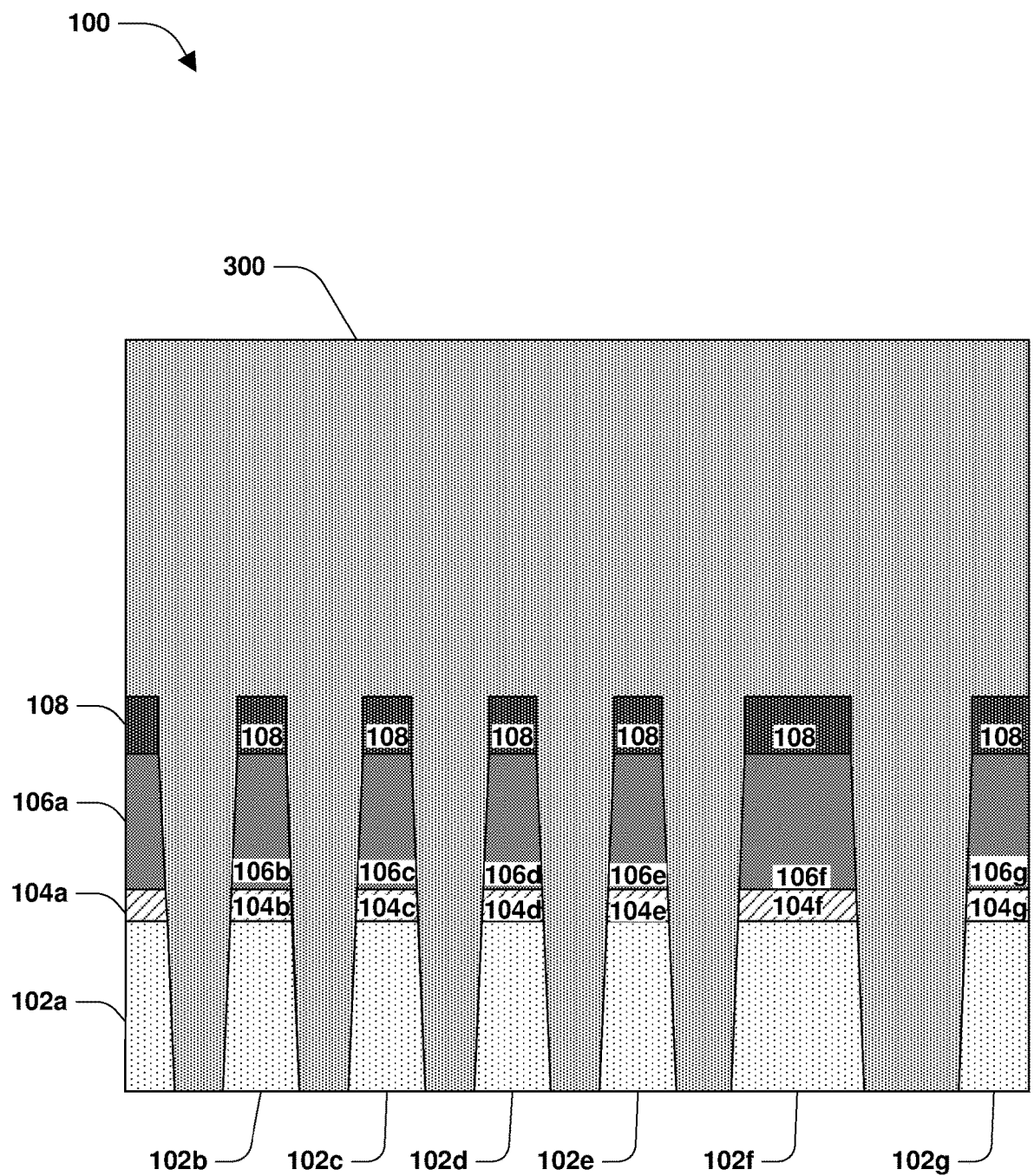

Referring to FIG. 3A, a dielectric layer 300 is formed over the hard mask 108 and within the recesses 202a-202f, in accordance with some embodiments. In some embodiments, the dielectric layer 300 is formed by a deposition process, such as CVD, PVD, PECVD, ALCVD, ALD, a spin-on technology, or other suitable deposition process. In some embodiments, the dielectric layer 300 comprises a low-k dielectric material, such as $SiO_xC_yH_z$, $SiO_x$, SiCN, oxygen doped SiC (ODC), nitrogen doped SiC (NDC), tetraethyl orthosilicate (TEOS), or other suitable material, where x, y, and z are integers greater than or equal to 1. As used herein, low-k dielectric material refers to a material having a k-value (dielectric constant) lower than about 3.9. Some low-k dielectric materials have a k-value lower than about 3.5 and may have a k-value lower than about 2.5. In some embodiments, the dielectric layer 300 comprises a single layer of material, as illustrated in FIG. 3A.

In some embodiments, the dielectric layer 300 overlies the hard mask 108 and is disposed laterally adjacent the first conductive structures 102a-102g, the etch stop layer structures 104a-104g, and the sacrificial material structures 106a-106g. In some embodiments, the dielectric layer 300 contacts at least one of the hard mask 108, the first conductive structures 102a-102g, the etch stop layer structures 104a-104g, or the sacrificial material structures 106a-106g. In some embodiments, the dielectric layer 300 contacts a top surface of the hard mask 108 and sidewalls of the hard mask 108, the first conductive structures 102a-102g, the etch stop layer structures 104a-104g, and the sacrificial material structures 106a-106g.

Figure 3B:
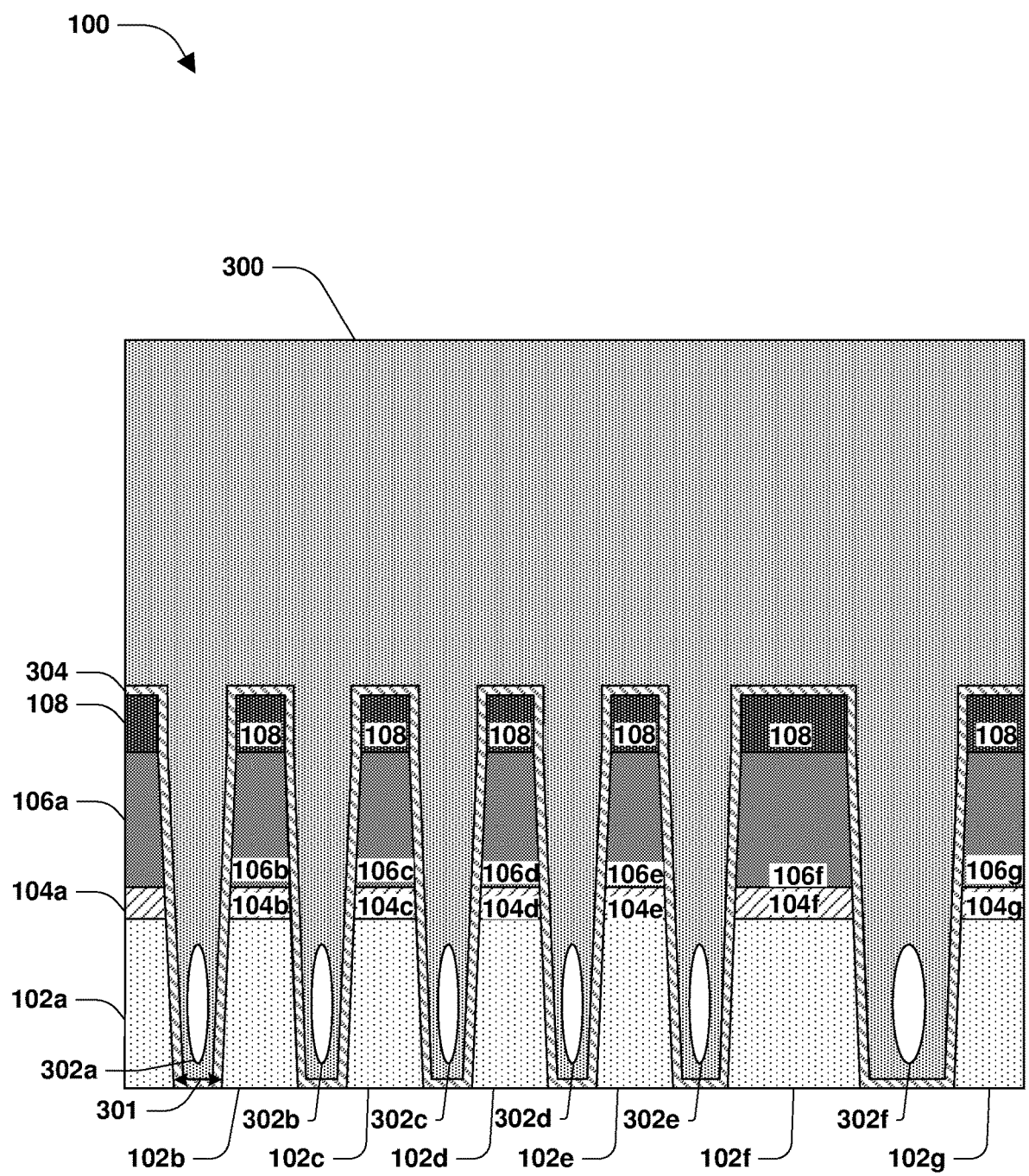
Figure 3C:
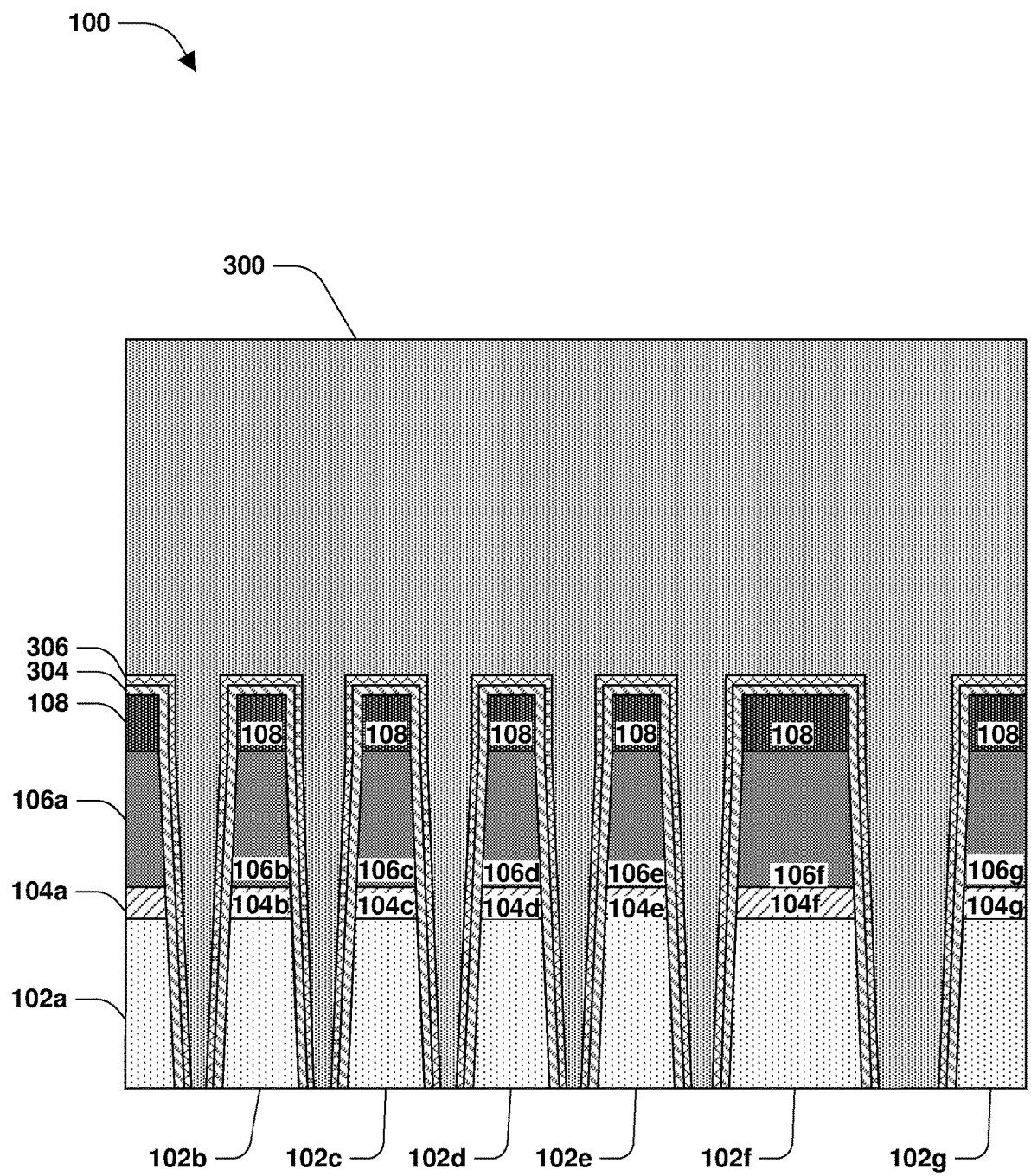
Figure 3D:
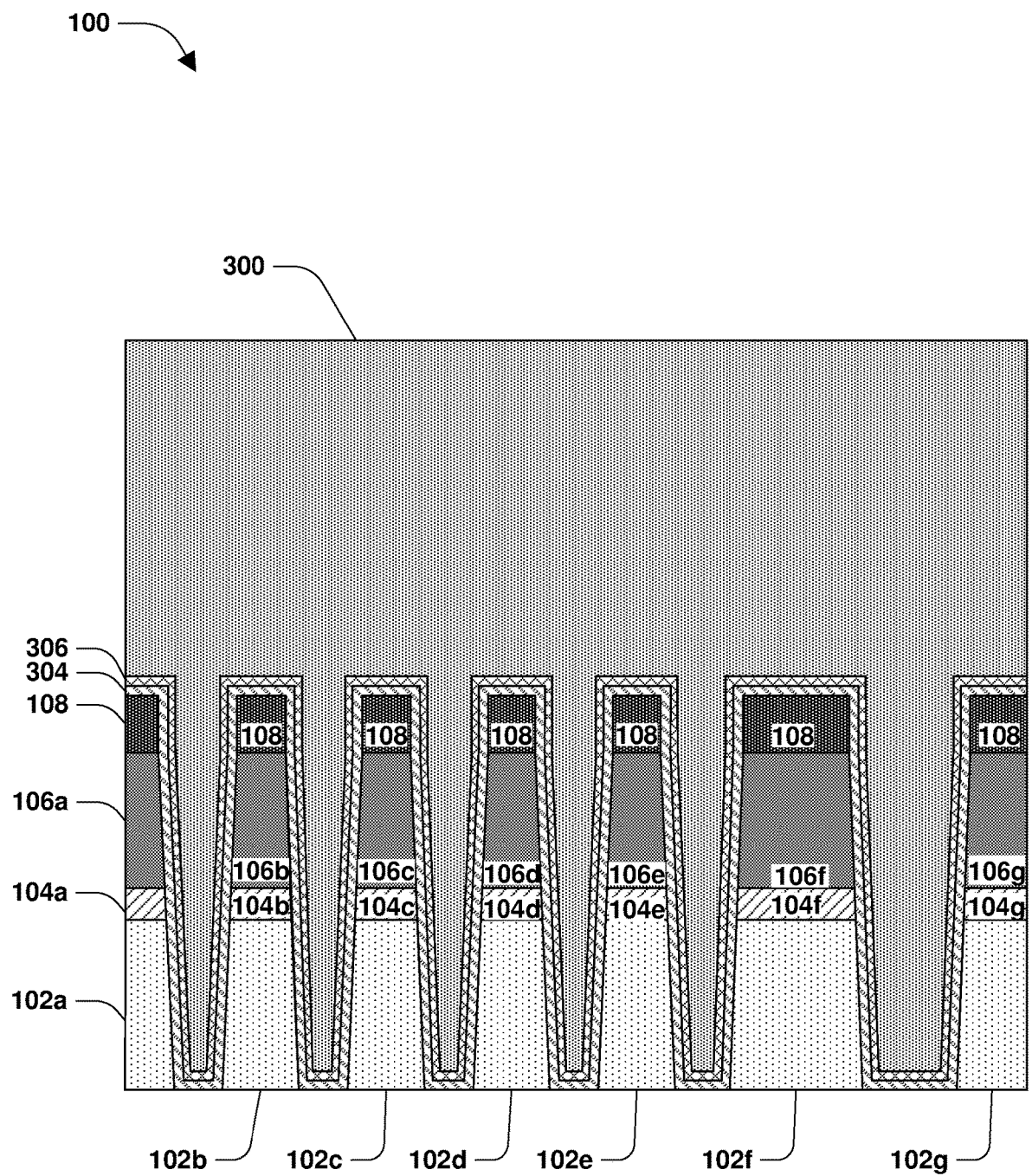

In some embodiments, multiple dielectric layers are formed over the hard mask 108 and within the recesses 202a-202f, as illustrated in FIGS. 3B-3D. Referring to FIG. 3B, a first embodiment for forming multiple dielectric layers is illustrated. In some embodiments, a second dielectric layer 304 is formed over the hard mask 108 and in the recesses 202a-202f along sidewalls of the first conductive structures 102a-102g, sidewalls of the etch stop layer structures 104a-104g, and sidewalls of the sacrificial material structures 106a-106g. In some embodiments, the second dielectric layer 304 is formed by a deposition process, such as CVD, PVD, PECVD, ALCVD, ALD, a spin-on technology, or other suitable deposition process. In some embodiments, the second dielectric layer 304 is formed to be conformal, such that the second dielectric layer 304 has a substantially uniform thickness. In some embodiments, the dielectric layer 300 is formed over the second dielectric layer 304. In some embodiments, the dielectric layer 300 is formed to be non-conformal, such that the dielectric layer 300 varies in thickness.

In some embodiments, the dielectric layer 300 comprises a first dielectric material and the second dielectric layer 304 comprises a second dielectric material. In some embodiments, the first dielectric material is different than the second dielectric material. In some embodiments, air gaps 302a-302f are formed within, and defined by, the dielectric layer 300 due to pinch off of the dielectric layer 300 near bottoms of the recesses 202a-202f, where the recesses 202a-202f may have smaller widths, such as width 301 between the conductive structure 102a and the conductive structure 102b, due to tapering of the recesses 202a-202f, for example. In some embodiments, the air gaps 302a-302f are formed between the first conductive structures 102a-102g. In some embodiments, the air gaps 302a-302f occupy about 20% to about 90% of a volume of a portion of the dielectric layer 300 between the first conductive structures 102a-102g.

In some embodiments, the second dielectric layer 304 is formed across bottoms of the recesses 202a-202f, from one of the first conductive structures 102a-102g to another, adjacent one of the first conductive structures 102a-102g, such that the dielectric layer 300 is separated from a layer underlying the first conductive structures 102a-102g and the recesses 202a-202f by the second dielectric layer 304. In some embodiments, an anisotropic etch process or other etch process is performed after forming the second dielectric layer 304 and before forming the dielectric layer 300 to remove horizontal portions of the second dielectric layer 304 prior to forming the dielectric layer 300. In some such embodiments, the dielectric layer 300 may therefore contact the layer underlying the first conductive structures 102a-102g and the recesses 202a-202f, for example.

Although air gaps 302a-302f are illustrated in an embodiment in which multiple dielectric layers 300, 304 are formed, air gaps 302a-302f may also be present in an embodiment in which merely a single dielectric layer 300 is formed over the hard mask 108 and within the recesses 202a-202f, such as illustrated in FIG. 3A.

Referring to FIG. 3C, a second embodiment for forming multiple dielectric layers is illustrated. In some embodiments, the second dielectric layer 304 is formed over the hard mask 108 and in the recesses 202a-202f along sidewalls of the first conductive structures 102a-102g, the etch stop layer structures 104a-104g, and the sacrificial material structures 106a-106g. In some embodiments, a third dielectric layer 306 is formed over the second dielectric layer 304. In some embodiments, the dielectric layer 300 is formed over the third dielectric layer 306. In some embodiments, the third dielectric layer 306 is formed by a deposition process, such as CVD, PVD, PECVD, ALCVD, ALD, a spin-on technology, or other suitable deposition process. In some embodiments, the second dielectric layer 304 and the third dielectric layer 306 are formed to be conformal, such that the second dielectric layer 304 has a substantially uniform thickness and the third dielectric layer 306 has a substantially uniform thickness. In some embodiments, the dielectric layer 300 is formed to be non-conformal, such that the dielectric layer 300 varies in thickness.

In some embodiments, the dielectric layer 300 comprises a first dielectric material, the second dielectric layer 304 comprises a second dielectric material, and the third dielectric layer 306 comprises a third dielectric material. In some embodiments, the first dielectric material is different than at least one of the second dielectric material or the third dielectric material. In some embodiments, the second dielectric material is different than at least one of the first dielectric material or the third dielectric material.

In some embodiments, the second dielectric layer 304 and the third dielectric layer 306 are formed across bottoms of the recesses 202a-202f, from one of the first conductive structures 102a-102g to another, adjacent one of the first conductive structures 102a-102g, such that the dielectric layer 300 is separated from a layer underlying the first conductive structures 102a-102g and the recesses 202a-202f by the second dielectric layer 304 and the third dielectric layer 306. In some embodiments, a anisotropic etch process or other etch process is performed after forming the second dielectric layer 304 and the third dielectric layer 306 and before forming the dielectric layer 300 to remove horizontal portions of the second dielectric layer 304 and third dielectric layer 306 prior to forming the dielectric layer 300. In some embodiments, a first anisotropic etch process or other etch process is performed after forming the second dielectric layer 304 and before forming the third dielectric layer 306 to remove horizontal portions of the second dielectric layer 304, and a second anisotropic etch process or other etch process is performed after forming the third dielectric layer 306 and before forming the dielectric layer 300 to remove horizontal portions of the third dielectric layer 306. In some such embodiments where horizontal portions of both the second dielectric layer 304 and the third dielectric layer 306 are removed, the dielectric layer 300 may therefore contact the layer underlying the first conductive structures 102a-102g and the recesses 202a-202f.

In some embodiments, an anisotropic etch process or other etch process is performed to remove horizontal portions of merely one of the second dielectric layer 304 or the third dielectric layer 306. For example, in some embodiments, an anisotropic etch process or other etch process is performed to remove horizontal portions of the second dielectric layer 304, the third dielectric layer 306 is formed, and then the dielectric layer 300 is formed on the third dielectric layer 306 without performing another etch process between the formation of the third dielectric layer 306 and the dielectric layer 300. In some such embodiments, the dielectric layer 300 may therefore be separated from the layer underlying the first conductive structures 102a-102g and the recesses 202a-202f by the third dielectric layer 306. As another example, in some embodiments, the second dielectric layer 304 is formed, the third dielectric layer 306 is formed over the second dielectric layer 304, an anisotropic etch process or other etch process is performed to remove merely horizontal portions of the third dielectric layer 306, and the dielectric layer 300 is formed after the vertical etch process. In some such embodiments, the dielectric layer 300 may therefore be separated from the layer underlying the first conductive structures 102a-102g and the recesses 202a-202f by the second dielectric layer 304.

Referring to FIG. 3D, a third embodiment for forming multiple dielectric layers is illustrated. In some embodiments, the second dielectric layer 304 and the third dielectric layer 306 are formed across bottoms of the recesses 202a-202f, from one of the first conductive structures 102a-102g to another, adjacent one of the first conductive structures 102a-102g. In some embodiments, no etch process is performed after forming the second dielectric layer 304 and the third dielectric layer 306, and the dielectric layer 300 is formed over the second dielectric layer 304 and the third dielectric layer 306, such that the dielectric layer 300 is separated from the layer underlying the first conductive structures 102a-102g and the recesses 202a-202f by the second dielectric layer 304 and the third dielectric layer 306.

Figure 4:
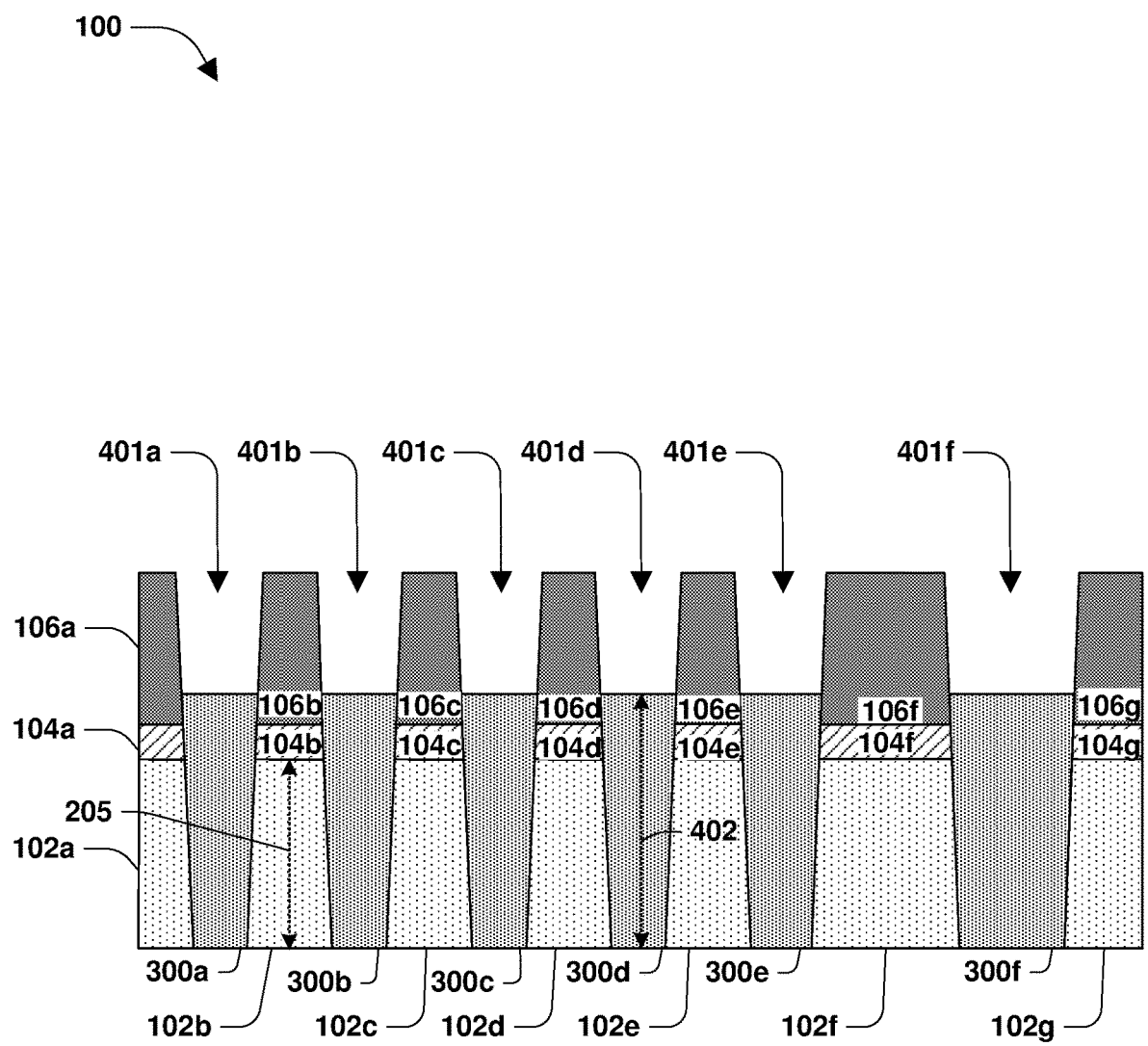

Referring to FIG. 4, a portion of the dielectric layer 300 is removed, in accordance with some embodiments. In some embodiments, an etch process is performed to remove the portion of the dielectric layer 300. In some embodiments, the etch process comprises a dry etch process, such as reactive ion etching (RIE), plasma enhanced (PE) etching, inductively coupled plasma (ICP) etching, or other dry etch process that etches back the dielectric layer 300 to define recesses 401a-401f. In some embodiments, removal of the portion of the dielectric layer 300 results in dielectric structures 300a-300f disposed between surfaces of two adjacent first conductive structures 102a-102g, such as between a sidewall of one of the first conductive structures 102a-102g and a sidewall of another, adjacent one of the first conductive structures 102a-102g. In some embodiments, the dielectric structures 300a-300f are formed between the etch stop layer structures 104a-104g. In some embodiments, the dielectric structures 300a-300f are formed between the sacrificial material structures 106a-106g. In some embodiments, top surfaces of the dielectric structures 300a-300f are above top surfaces of the first conductive structures 102a-102g by between about 0 angstrom and 200 angstrom. Thus, in some embodiments, heights of the dielectric structures 300a-300f, such as a height 402 of the dielectric structure 300d, are greater than the heights of the first conductive structures 102a-102g, such as the height 205 of the conductive structure 102b, by between about 0 angstrom and 200 angstrom.

In some embodiments, a chemical-mechanical planarization (CMP) process is performed before the dry etch to remove some of the dielectric layer 300 prior to the etch process to etch back the dielectric layer 300 to define the recesses 401a-401f. In some embodiments, the CMP process exposes the hard mask 108. In some embodiments, a second CMP process or a second etch process is performed after the etch process that etches back the dielectric layer to define the recesses 401a-401f to remove the hard mask 108. In some embodiments, the second CMP process or the second etch process to remove the hard mask 108 exposes a top surface of the sacrificial material structures 106a-106g.

In some embodiments, where multiple dielectric layers were formed in the recesses 202a-f, such as dielectric layers 300, 304, and 306, each of the multiple dielectric layers may be subject to the CMP process or may be subject to an etch process to etch back the multiple dielectric layers. In some embodiments, the same etch back process may be used to etch back each of the multiple dielectric layers. In some embodiments, the etch back process used to etch back one or more of the multiple dielectric layers may be different than the etch back process used to etch back another one or more of the multiple dielectric layers.

Figure 5:
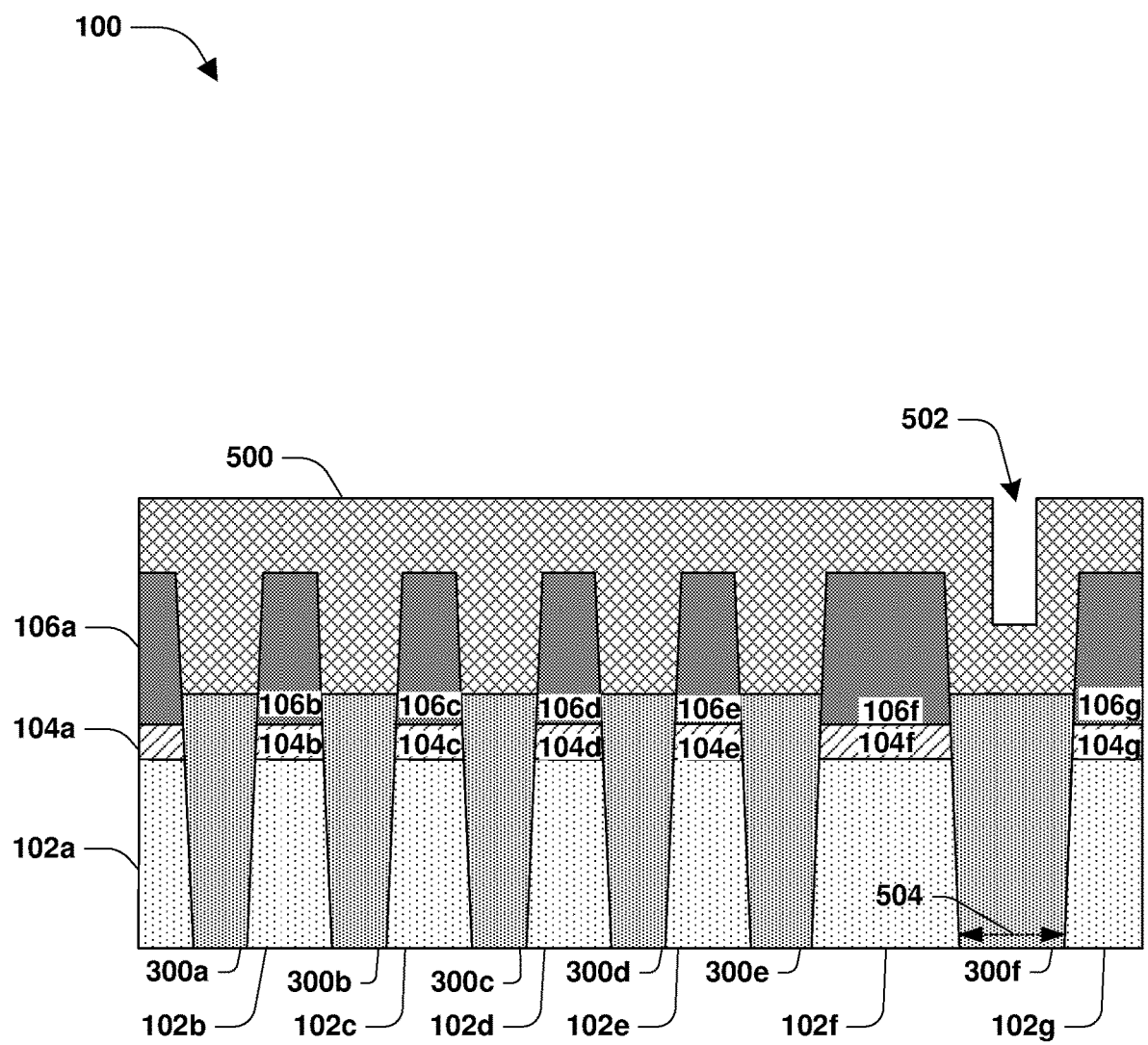

Referring to FIG. 5, a spacer layer 500 is formed over the dielectric structures 300a-300f and the sacrificial material structures 106a-106g, in accordance with some embodiments. In some embodiments, the spacer layer 500 is formed by a deposition process, such as CVD, PVD, PECVD, ALCVD, ALD, a spin-on technology, or other suitable deposition process. In some embodiments, the spacer layer 500 overlies the sacrificial material structures 106a-106g and is disposed laterally adjacent sacrificial material structures 106a-106g. In some embodiments, the spacer layer 500 contacts the sacrificial material structures 106a-106g. In some embodiments, the spacer layer 500 contacts top surfaces of the sacrificial material structures 106a-106g and sidewalls of the sacrificial material structures 106a-106g.

In some embodiments, the spacer layer 500 comprises SiCN, $SiO_2$, $SiN_x$, $AlO_xN_y$, $AlO_x$, TiN, TiO, $ZrO_x$, $HfO_x$, or other suitable metal material, where x and y are integers greater than or equal to 1. In some embodiments, the spacer layer 500 comprises a high-k dielectric material. High-k dielectric materials have a k-value (dielectric constant) greater than or equal to about 3.9, which is the k value of $SiO_2$. In some embodiments, the material of the spacer layer 500 is selected to have a different etch selectivity than the materials of the sacrificial material structures 106a-106g and the etch stop layer structures 104a-104g.

In some embodiments, where a width of a dielectric structure 300a-300f, such as a width 504 of the dielectric structure 300f exceeds a specified threshold, a recess, such as recess 502, is defined by the spacer layer 500. In other embodiments, the spacer layer 500 is formed so as to have a substantially planar top surface regardless of the widths of the dielectric structures 300a-300f.

Figure 6:
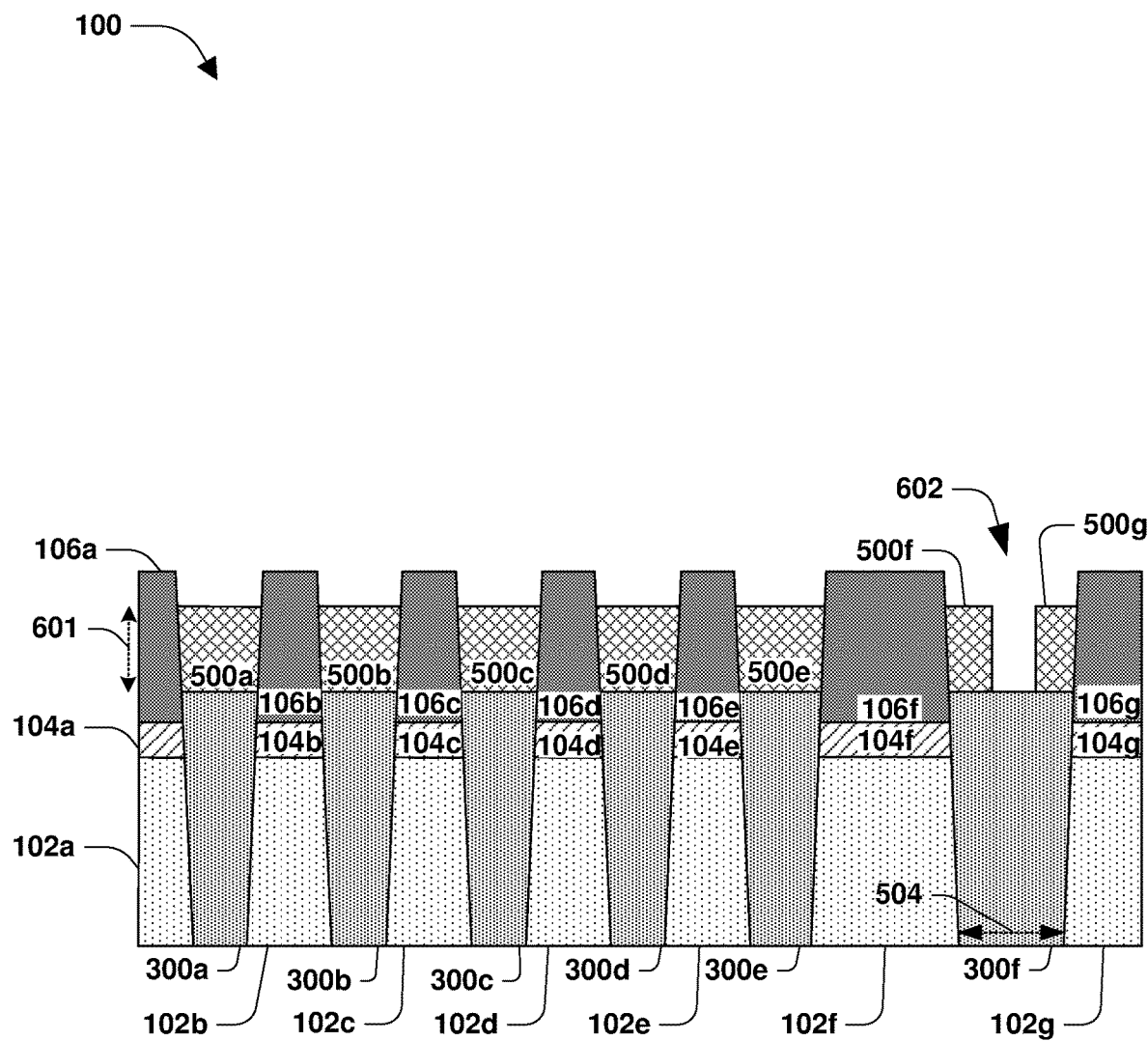

Referring to FIG. 6, a portion of the spacer layer 500 is removed, in accordance with some embodiments. In some embodiments, an etch process is performed to remove the portion of the spacer layer 500. In some embodiments, the etch process comprises a dry etch process, such as reactive ion etching (RIE), plasma enhanced (PE) etching, inductively coupled plasma (ICP) etching, or other dry etch process that etches back the spacer layer 500. In some embodiments, removal of the portion of the spacer layer 500 results in spacer structures 500a-500g being formed between the sacrificial material structures 106a-106g and over the dielectric structures 300a-300f and results in top surfaces of the sacrificial material structures 106a-106g being exposed. In some embodiments, top surfaces of the spacer structures 500a-500g are below top surfaces of the sacrificial material structures 106a-106g. In some embodiments, the spacer structures 500a-500g have height between about 30 angstroms and 100 angstroms. For example, the spacer structure 500a may have a height 601 between about 30 angstroms and 100 angstroms. In some embodiments, top surfaces of the etch stop layer structures 104a-104g are vertically spaced apart from top surfaces of the spacer structures 500*a*-500*g* by the dielectric structures 300*a*-300*f.*

In some embodiments, where a recess is defined by the spacer layer 500 when the width of a dielectric structure 300*a*-300*f* exceeds a specified threshold, such as the recess 502 defined by the spacer layer 500 when the width 504 of the dielectric structure 300*f* exceeds the specified threshold, the etch process causes a top surface of the dielectric structure that exceeds the specified threshold, such as a top surface of the dielectric structure 300*f,* to be exposed. For example, referring to FIG. 6, the spacer structure 500*g* does not extend from a sidewall of one of the sacrificial material structures 106*g* to another, adjacent one of the sacrificial material structures 106*f* because the width 504 of the underlying dielectric structure 300*f* is greater than the specified threshold. Thus, two, distinct spacer structures 500*f* and 500*g* are formed that overlie the dielectric structure 300*f,* and an opening 602 is defined between the two, distinct spacer structures 500*f* and 500*g.* In contrast, the five leftmost spacer structure 500*a*-500*e* extend from a sidewall of one of the sacrificial material structures to another, adjacent one of the sacrificial material structures, such as the spacer structure 500*a* extending from a sidewall of the sacrificial material structure 106*a* to the sidewall of another, adjacent sacrificial material structure 106*b,* because the widths of the underlying dielectric structures 300*a*-300*e* are less than or equal to the specified threshold. In some embodiments, where the spacer layer 500 is formed so as to have a substantially planar top surface regardless of the widths of the dielectric structures 300*a*-300*f,* top surfaces of the underlying dielectric structures 300*a*-300*f* remains concealed by the spacer structures 500*a*-500*g* even if the width of a dielectric structure 300*a*-300*f* exceeds the specified threshold.

Figure 7:
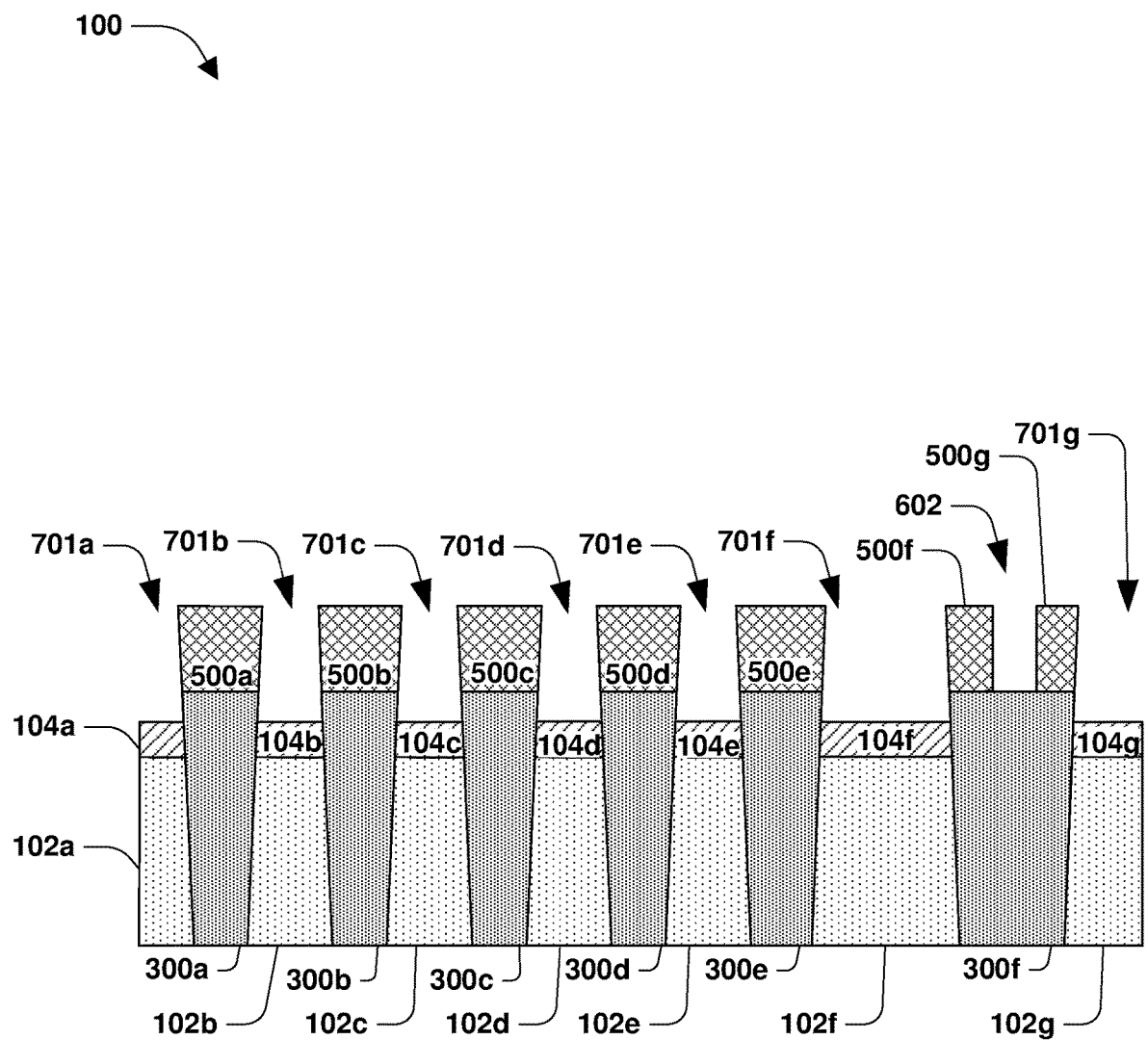

Referring to FIG. 7, the sacrificial material structures 106*a*-106*g* are removed to create recesses 701*a*-701*g,* in accordance with some embodiments. In some embodiments, an etch process is performed to remove the sacrificial material structures 106*a*-106*g.* In some embodiments, the etch process comprises a wet etch process, such as a chemical etch using a hot phosphoric acid solution or other etchants. In some embodiments, the etch process exposes sidewalls of at least one of the spacer structures 500*a*-500*g* or the dielectric structures 300*a*-300*f.* In some embodiments, the etch process exposes top surfaces of the etch stop layer structures 104*a*-104*g.* In some embodiments, because the sacrificial material structures 106*a*-106*g* have a different etch selectivity than the spacer structures 500*a*-500*g,* the etch process does not remove the spacer structures 500*a*-500*g.*

Referring to FIG. 8, a second dielectric layer 800 is formed over the spacer structures 500*a*-500*g* and the etch stop layer structures 104*a*-104*g,* in accordance with some embodiment. In some embodiments, the second dielectric layer 800 is formed within the recesses 701*a*-701*g.* In some embodiments, the second dielectric layer 800 is formed by a deposition process, such as CVD, PVD, PECVD, ALCVD, ALD, a spin-on technology, or other suitable deposition process. In some embodiments, the second dielectric layer 800 comprises $SiO_xC_yH_z$, $SiO_x$, SiCN, ODC, NDC, TEOS, a low-k dielectric material, or other suitable material, where x, y, and z are integers greater than or equal to one. In some embodiments, a CMP process is performed after the second dielectric layer 800 is formed to planarize the second dielectric layer 800.

Referring to FIGS. 9A-9D, a portion of the second dielectric layer 800 is removed, in accordance with some embodiments. In some embodiments, a second hard mask 902 is formed over some portions of the second dielectric layer 800, and portions of the second dielectric layer 800 not concealed by the second hard mask 902 are etched using a dual damascene process, such as a back end of line dual damascene process, using a "via-first" patterning method or a "trench-first" patterning method. Referring to FIG. 9A, in some embodiments of a "trench-first" patterning method, a first etch of the dual damascene process etches an upper portion of the second dielectric layer 800 not concealed by the second hard mask 902 to define a first opening 901. In some embodiments, the first etch may stop when a remaining portion of the second dielectric layer 800 has a height 905 between about 100 angstroms and 500 angstroms. Referring to FIG. 9B, in some embodiments, a second etch of the dual damascene process etches a lower portion of the second dielectric layer 800 to define multiple distinct openings 903*a*-903*c* overlying the first conductive structures 102*a*-102*g* and to form second dielectric structures 800*a*-800*d* from the second dielectric layer 800. In some embodiments, at least some of the spacer structures 500*a*-500*g,* such as the spacer structure 500*e* and the spacer structure 500*g,* remain encapsulated by dielectric structures 300*a*-300*f* and second dielectric structures 800*a*-800*d* after the dual damascene process. FIG. 9C illustrates top-down views of the semiconductor device 100 after the second etch of the dual damascene process is performed, and FIG. 9D illustrates a similar to-down view, except the second hard mask 902 and the second dielectric layer 800 have been hidden to reveal the spacer structures 500*a*-500*g* and the etch stop layer structures 104*a*-104*g.*

Referring to the FIGS. 9B-9D, where 9B is a cross-sectional view at line 9-9 in FIGS. 9C and 9D, in some embodiments the spacer structures 500*a*-500*g* are configured to self-align the openings 903*a*-903*c* with the first conductive structures 102*a*-102*g* such that the openings 903*a*-903*c* overlie the first conductive structures 102*a*-102*g.* For example, the material of the spacer structures 500*a*-500*g* may be selected such that the spacer structures 500*a*-500*g* are etched at a slower etch rate than the second dielectric layer 800. When an overlay structure used during the second portion of the dual damascene process, for example, is placed over the second hard mask 902, windows 904, 906, 908 in the overlay structure are intended to be aligned with the first conductive structures 102*a*-102*g* to enable the openings 903*a*-903*c* that overlie the first conductive structures 102*a*-102*g* to be formed in the second dielectric layer 800. Nevertheless, due to machine tolerances, for example, the windows 904, 906, 908 may not be perfectly aligned with the first conductive structures 102*a*-102*g.* Rather, the windows 904, 906, 908 may be shifted in one or more directions, as illustrated by windows 906 and 908 in FIGS. 9C and 9D, which are shifted in an x direction (extending left-to-right on the page) and shifted in a y direction (extending top-to-bottom on the page). In some embodiments, due to the slower etch rate of the spacer structures 500*a*-500*g* relative to the second dielectric layer 800, the openings 903*a*-903*c* formed in the second dielectric layer 800 during the second etch of the dual damascene process may be aligned with the first conductive structures 102*a*-102*g* even though the windows 906, 908 are not aligned with the first conductive structures 102*a*-102*g.* In some embodiments, the spacer structures 500*a*-500*g* also protect the dielectric structures 300*a*-300*f* from being etched during the dual damascene process.

In some embodiments, while the etch selectivity of the spacer structures 500*a*-500*g* may mitigate etching of the spacer structures 500a-500g during the etch process to remove the portion of the second dielectric layer 800, at least some of portions the spacer structures 500a-500g may be removed during the etch process. For example, in some embodiments, corners of at least one of the spacer structures 500a-500g, such one or more corners of spacer structures 500a, 500b, 500c, 500d, and 500f, exposed through the windows 904, 906, 908 during the etch process may be etched, resulting in the spacer structures 500a, 500b, 500c, 500d, and 500f having a rounded or curved surfaces. While the illustrated example describes a "trench-first" patterning method in which the first opening 901 is formed before the openings 903a-903c, in some embodiments, the dual damascene process uses a "via-first" patterning method in which the openings 903a-903c are formed before the first opening 901.

Figure 10:
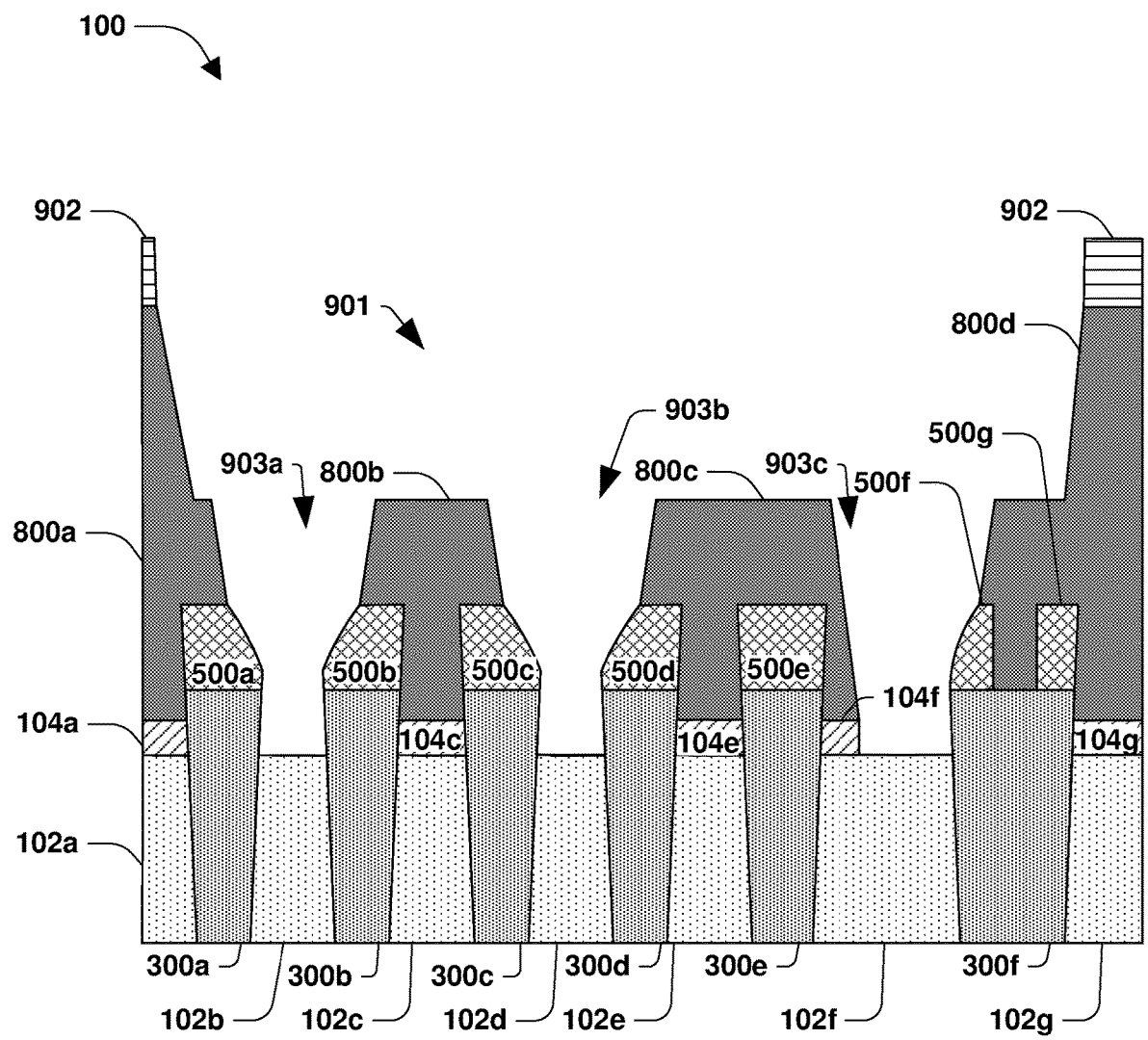
FIGS. 10 and 11 are illustrations of cross-sectional views of a semiconductor device at various stages of fabrication, in accordance with some embodiments.
Figure 11:
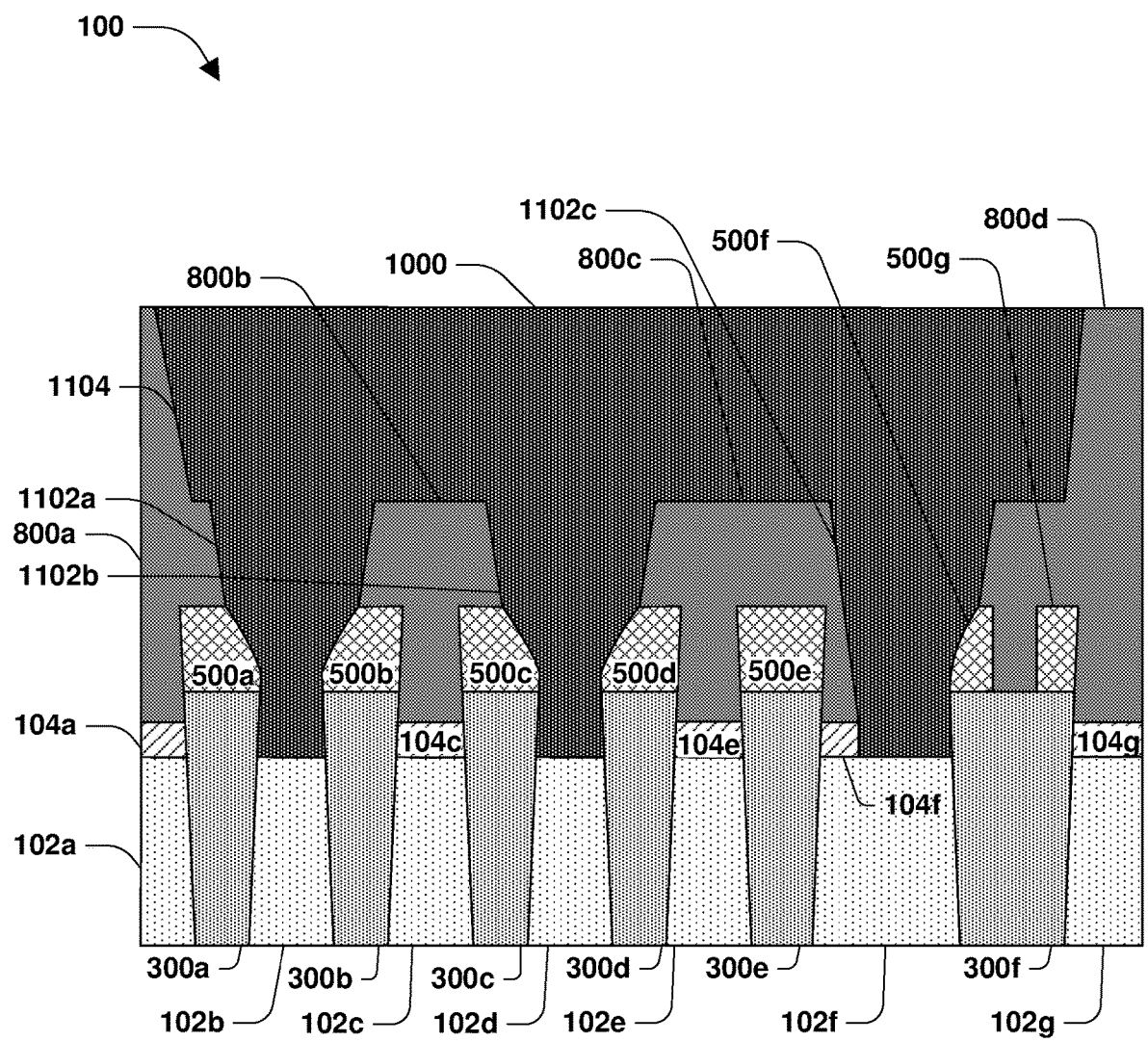

Referring to FIG. 10, portions of the etch stop layer structures 104a-104g exposed through the openings 903a-903c are removed, in accordance with some embodiments. In some embodiments, the one or more etch stop layer structures 104a-104g, such as etch stop layer structures 104b, 104d, and a portion of etch stop layer structure 104f, are removed using an etch process selective to a material of the etch stop layer structures 104a-104g. Thus, in some embodiments, portions of the etch stop layers structures 104a-104g, such as portions of the etch stop layer structures 104a, 104c, 104e, 104f, and 104g, that are concealed by at least one of the second dielectric structures 800a-800d are protected from being etched during the etch process Referring to FIG. 11, a second conductive layer 1000 is formed, in accordance with some embodiments. In some embodiments, the second conductive layer 1000 is formed by a deposition process, such as CVD, PVD, PECVD, ALCVD, ALD, a spin-on technology, or other suitable deposition process. In some embodiments, the second conductive layer 1000 comprises a conductive material, such as Cu, Ru, W, Ti, Al, Co, Mo, Ir, Rh, or other suitable metal material. In some embodiments, the second conductive layer 1000 forms vias 1102a-1102c in the openings 903a-903c over and in contact with the first conductive structures 102a-102g and also forms a second conductive structure 1104 overlying the vias 1102a-1102c and electrically coupled to a plurality of the vias 1102a-1102c. In some embodiments, a chemical mechanical polishing process is performed after the second conductive layer 1000 to planarize a top surface of the second conductive layer 1000 and to remove the second hard mask 902.

Figure 12:
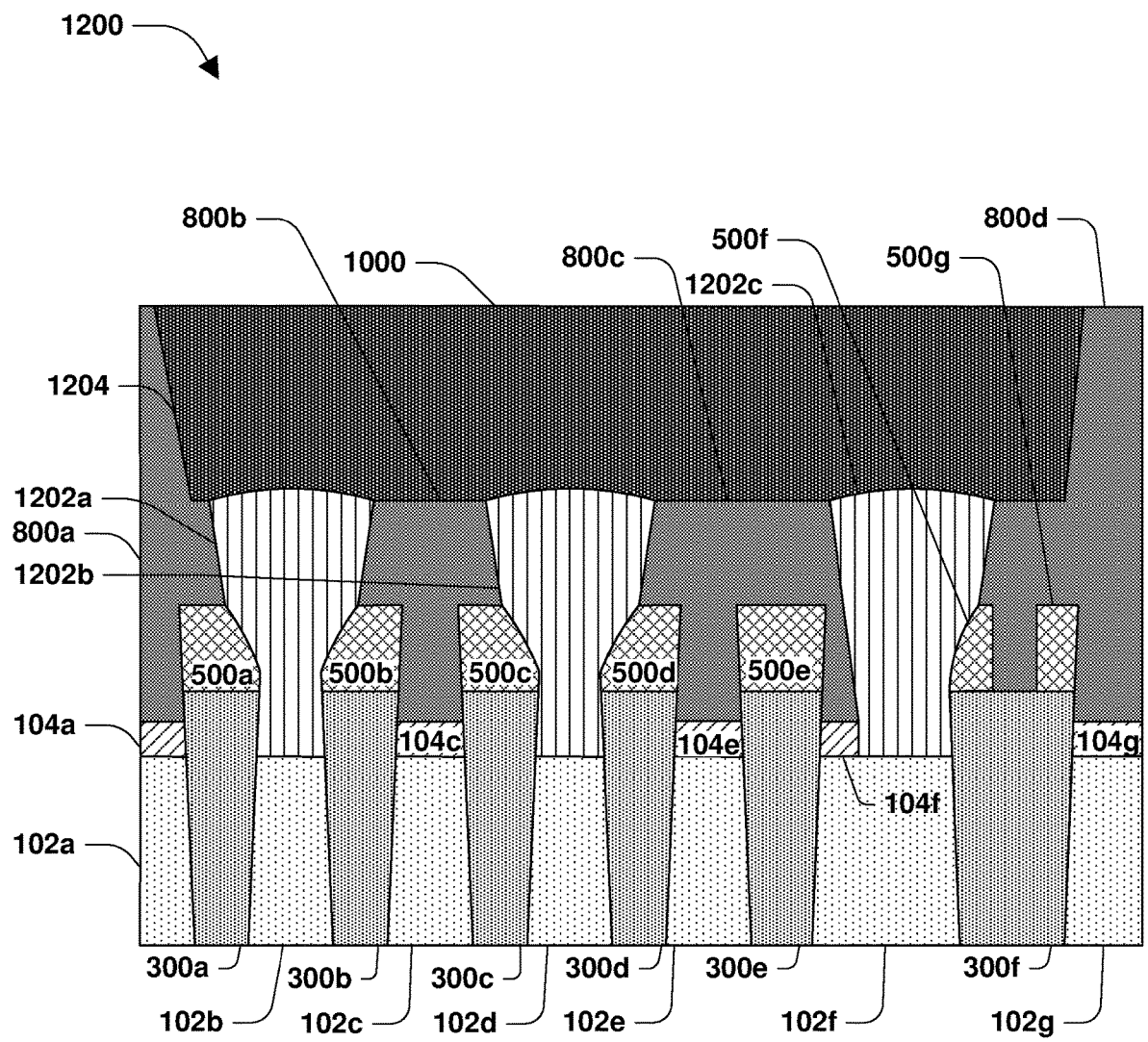
FIG. 12 is an illustration of a cross-sectional view of a semiconductor device, in accordance with some embodiments.

FIG. 12 is a cross-sectional view of a semiconductor device 1200 formed with spacer structures 500a-500g, in accordance with some embodiments. The semiconductor device 1200 differs from the semiconductor device 100 of FIGS. 1-11 in that vias 1202a-1202c are formed in the openings 903a-903c over and in contact with the first conductive structures 102a-102g prior to forming the second conductive layer 1000, and the second conductive layer 1000 is formed over the vias 1202a-1202c to define a second conductive structure 1204 overlying the vias 1202a-1202c and electrically coupled to a plurality of the vias 1202a-1202c. In some embodiments, the vias 1202a-1202c are formed using a growth process, and the second conductive layer 1000 is formed by depositing a metal material over the vias 1202a-1202c. In some embodiments, the vias 1202a-1202c are formed by a pre-fill process that fills the openings 903a-903c over the first conductive structures 102a-102g with metal material, and then the second conductive layer 1000 is formed over the vias 1202a-1202c to define a second conductive structure 1204. In some embodiments, the spacer structures 500a-500g confine the formation of the vias 1202a-1202c to contact and align with the first conductive structures 102a-102g. In some embodiments, the vias 1202a-1202c comprise a conductive material. Examples of the conductive material include but are not limited to Co, Mo, W, CoWP, Cu, Ru, Al, Ti, or other suitable conductive material. In some embodiments, the vias 1202a-1202c comprise a different material composition than the second conductive layer 1000.

Figure 13:
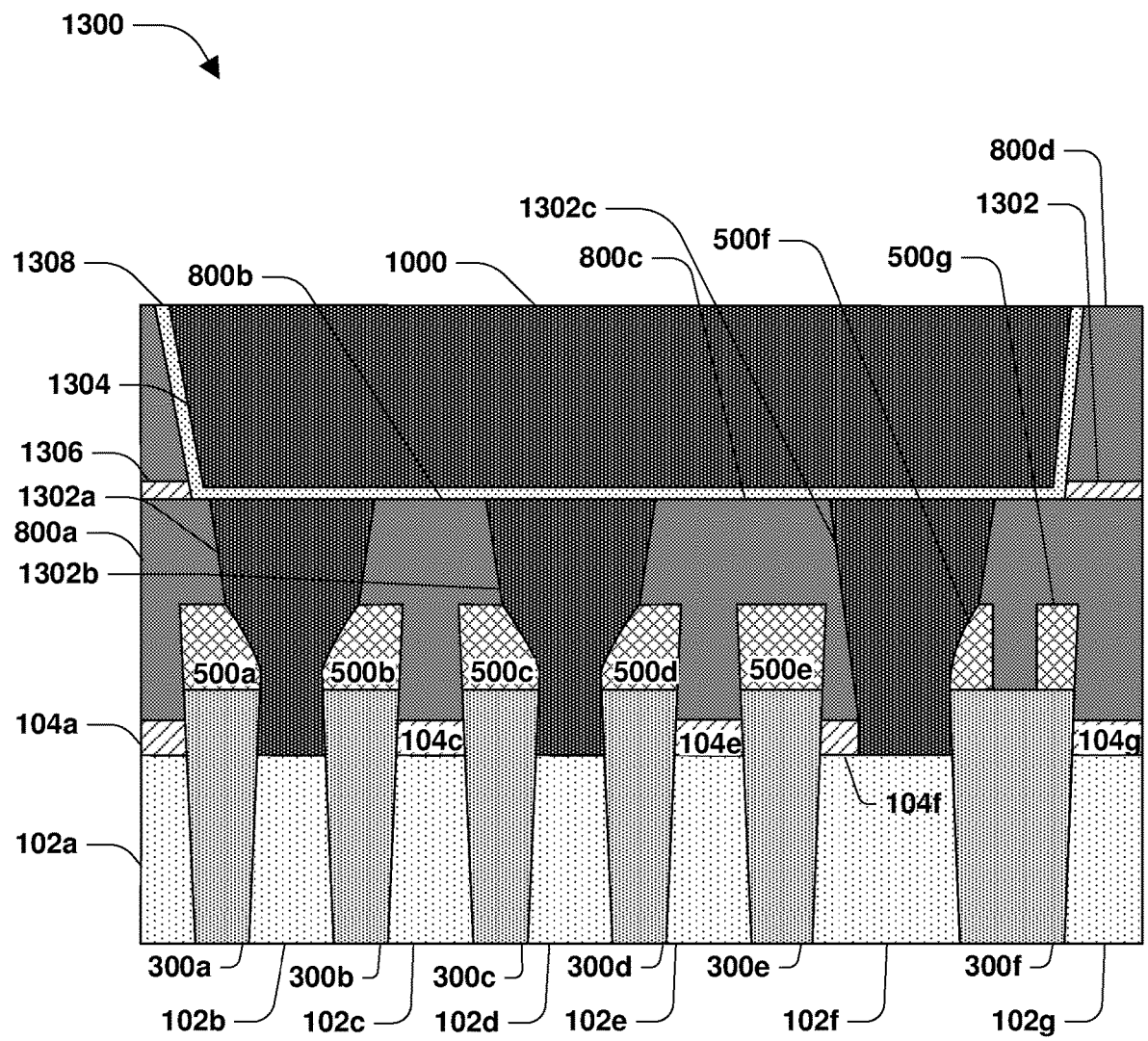
FIG. 13 is an illustration of a cross-sectional view of a semiconductor device, in accordance with some embodiments.

FIG. 13 is a cross-sectional view of a semiconductor device 1300 formed with spacer structures 500a-500g, in accordance with some embodiments. The semiconductor device 1300 differs from the semiconductor device 100 of FIGS. 1-11 in that an etch stop layer 1306 is formed between a first portion of the second dielectric layer 800 and a second portion of the second dielectric layer 800. The first portion of the second dielectric layer 800 and the second portion of the second dielectric layer 800 may have a same material composition or the material composition of the first portion of the second dielectric layer 800 may be different than the material composition of the second portion of the second dielectric layer 800. In some embodiments, during the dual damascene etch process described with respect to FIGS. 9A-9C, the etch stop layer 1306 serves as a stop for the first etch process of the dual damascene etch process.

The semiconductor device 1300 also differs from the semiconductor device 100 of FIGS. 1-11 in that a barrier layer 1308 is formed between vias 1302a-1302c and the second conductive layer 1000, which defines a second conductive structure 1304. In some embodiments, the vias 1302a-1302c are formed through a deposition process or a growth process in the openings 903a-903c. The barrier layer 1308 is then formed over the vias 1302a-1302c. In some embodiments, the barrier layer 1308 is formed by a conformal deposition process. In some embodiments, after the barrier layer 1308 is formed, the second conductive layer 1000 is formed to define a second conductive structure 1304. In some embodiments, the second conductive structure 1304 is electrically coupled to a plurality of the vias 1302a-1302c through the barrier layer 1308. In some embodiments, the barrier layer 1308 comprises Ta, TaN, Co, Ru, Ti, TiN, SAM, MnN$_x$, or other suitable barrier material.

Figure 14:
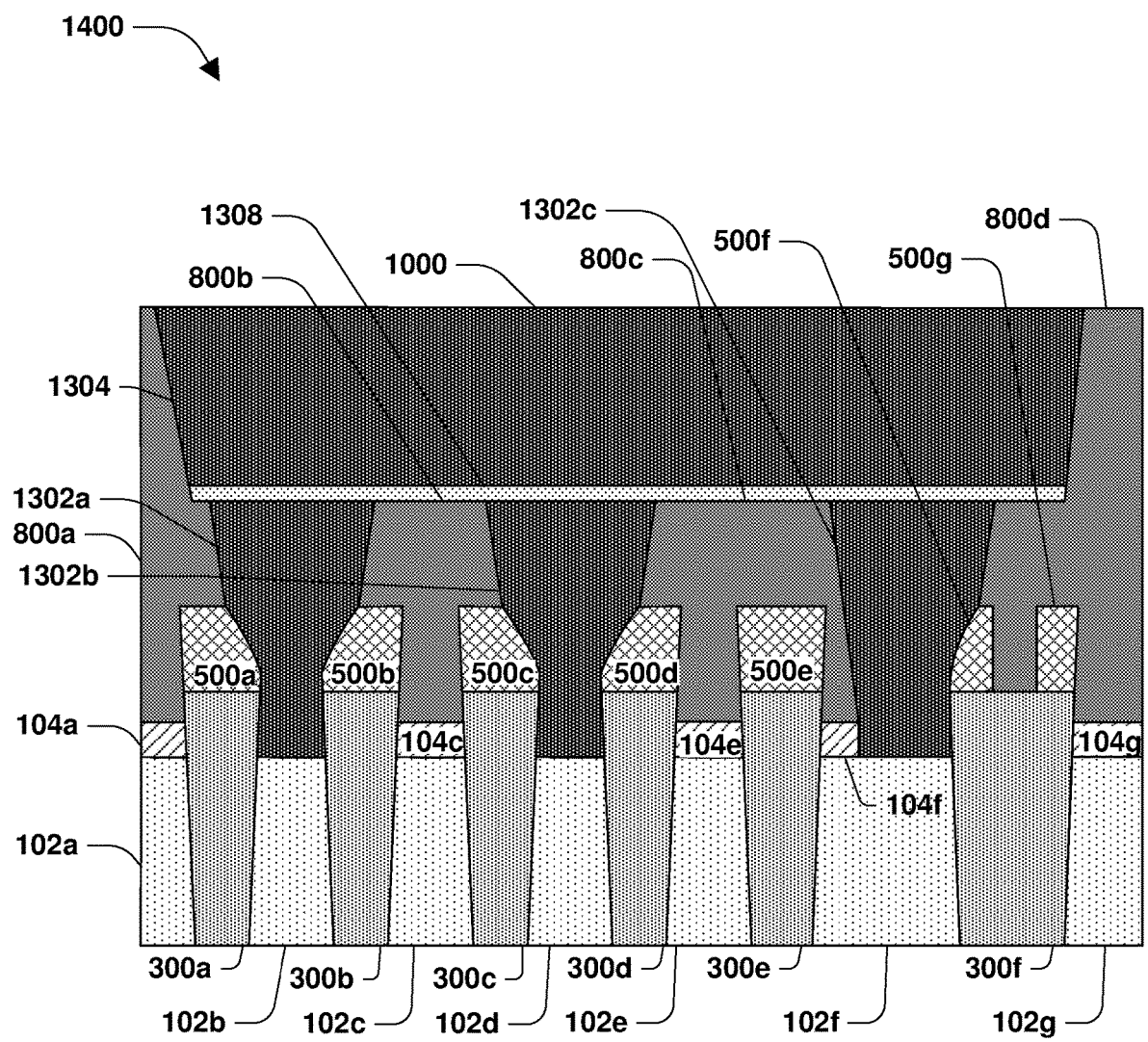
FIG. 14 is an illustration of a cross-sectional view of a semiconductor device, in accordance with some embodiments.

FIG. 14 is a cross-sectional view of a semiconductor device 1400 formed with spacer structures 500a-500g. The semiconductor device 1400 differs from the semiconductor device 1300 of FIG. 13 in that the etch stop layer 1306 is absent, and the barrier layer 1308 does not extend along the sidewall of the second dielectric structures 800a-800d to a top surface of the second dielectric structures 800a-800d. In some embodiments, the barrier layer 1308 is formed in a similar manner to that described with respect to FIG. 13. However, prior to forming the second conductive layer 1000, in some embodiments an etch process is performed to remove the barrier layer 1308 adjacent sidewalls of the second dielectric structures 800a-800d and expose the sidewalls of the second dielectric structures 800a-800d. When the second conductive layer 1000 is formed thereafter, in some embodiments, the second conductive layer 1000 contacts exposed the sidewalls of the second dielectric structures 800a-800d.

According to some embodiments, a semiconductor device is provided. The semiconductor device includes a first conductive structure. The semiconductor device includes a first dielectric structure. The semiconductor device includes a second conductive structure. The first dielectric structure is positioned between a first surface of the first conductive structure and a surface of the second conductive structure.

The semiconductor device includes an etch stop layer overlaying the first conductive structure. The semiconductor device includes a first spacer structure overlaying the first dielectric structure. The semiconductor device includes a second dielectric structure overlaying the first spacer structure and the etch stop layer.

According to some embodiments, a method for forming a semiconductor device is provided. The method includes forming a first dielectric structure and a second dielectric structure. A conductive structure and a sacrificial material structure are disposed between the first dielectric structure and the second dielectric structure. The method includes removing a portion of the first dielectric structure to define a first recess. The method includes forming a spacer structure in the first recess. The method includes removing at least some of the sacrificial material structure to define a second recess. The method includes forming a dielectric layer over the spacer and in the second recess.

According to some embodiments, a semiconductor device is provided. The semiconductor device includes a conductive structure. The semiconductor device includes a first dielectric structure. The semiconductor device includes a second dielectric structure. The conductive structure is positioned between a sidewall of the first dielectric structure and a sidewall of the second dielectric structure. The semiconductor device includes an etch stop layer overlying the conductive structure. The etch stop layer is between the sidewall of the first dielectric structure and the sidewall of the second dielectric structure. The semiconductor device includes a spacer structure overlaying the first dielectric structure. The semiconductor device includes a third dielectric structure overlying the spacer structure and the etch stop layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

Various operations of embodiments are provided herein. The order in which some or all of the operations are described should not be construed to imply that these operations are necessarily order dependent. Alternative ordering will be appreciated having the benefit of this description. Further, it will be understood that not all operations are necessarily present in each embodiment provided herein. Also, it will be understood that not all operations are necessary.

It will be appreciated that layers, features, elements, etc. depicted herein are illustrated with particular dimensions relative to one another, such as structural dimensions or orientations, for example, for purposes of simplicity and ease of understanding and that actual dimensions of the same differ substantially from that illustrated herein, In an or more embodiments. Additionally, a variety of techniques exist for forming the layers features, elements, etc. mentioned herein, such as etching techniques, implanting techniques, doping techniques, spin-on techniques, sputtering techniques such as magnetron or ion beam sputtering, growth techniques, such as thermal growth or deposition techniques such as CVD, PVD, PECVD, or ALD, for example.

Moreover, "exemplary" is used herein to mean serving as an example, instance, illustration, etc., and not necessarily as advantageous. As used in this application, "or" is intended to mean an inclusive "or" rather than an exclusive "or". In addition, "a" and "an" as used in this application and the appended claims are generally be construed to mean "one or more" unless specified otherwise or clear from context to be directed to a singular form. Also, at least one of A and B and/or the like generally means A or B or both A and B. Furthermore, to the extent that "includes", "having", "has", "with", or variants thereof are used, such terms are intended to be inclusive in a manner similar to the term "comprising". Also, unless specified otherwise, "first," "second," or the like are not intended to imply a temporal aspect, a spatial aspect, an ordering, etc. Rather, such terms are merely used as identifiers, names, etc. for features, elements, items, etc. For example, a first element and a second element generally correspond to element A and element B or two different or two identical elements or the same element.

Also, although the disclosure has been shown and described with respect to one or more implementations, equivalent alterations and modifications will occur to others skilled in the art based upon a reading and understanding of this specification and the annexed drawings. The disclosure comprises all such modifications and alterations and is limited only by the scope of the following claims. In particular regard to the various functions performed by the above described components (e.g., elements, resources, etc.), the terms used to describe such components are intended to correspond, unless otherwise indicated, to any component which performs the specified function of the described component (e.g., that is functionally equivalent), even though not structurally equivalent to the disclosed structure. In addition, while a particular feature of the disclosure may have been disclosed with respect to only one of several implementations, such feature may be combined with one or more other features of the other implementations as may be desired and advantageous for any given or particular application.

What is claimed is:

1. A semiconductor device, comprising:
   a first conductive structure;
   a first dielectric structure;
   a second conductive structure, wherein the first dielectric structure is between a first surface of the first conductive structure and a surface of the second conductive structure;
   an etch stop layer overlying the first conductive structure;
   a first spacer structure overlying the first dielectric structure, wherein the etch stop layer is spaced apart from the first spacer structure by the first dielectric structure; and
   a second dielectric structure overlying the first spacer structure and the etch stop layer.

2. The semiconductor device of claim 1, wherein the first dielectric structure and the second dielectric structure encapsulate the first spacer structure.

3. The semiconductor device of claim 1, comprising a third conductive structure in contact with the first conductive structure, the etch stop layer and the second dielectric structure.

4. The semiconductor device of claim 1, wherein the etch stop layer overlies the second conductive structure.

5. The semiconductor device of claim 1, wherein the first dielectric structure defines an air gap.

6. The semiconductor device of claim 1, comprising a barrier layer overlying the second dielectric structure.

7. The semiconductor device of claim 1, comprising:
a third dielectric structure;
a third conductive structure, wherein the third dielectric structure is between a second surface of the first conductive structure and a surface of the third conductive structure; and
a second spacer structure overlying the third dielectric structure, wherein the second dielectric structure overlies the second spacer structure.

8. The semiconductor device of claim 7, wherein the third dielectric structure is in contact with the first conductive structure and the etch stop layer.

9. The semiconductor device of claim 7, comprising a fourth conductive structure, wherein the fourth conductive structure overlies the second spacer structure and contacts the third conductive structure.

10. The semiconductor device of claim 9, comprising a barrier structure overlying the fourth conductive structure and the second dielectric structure.

11. The semiconductor device of claim 1, wherein the second dielectric structure is spaced apart from the first conductive structure by the etch stop layer.

12. The semiconductor device of claim 1, comprising a third conductive structure in contact with the first spacer structure.

13. A semiconductor device, comprising:
a conductive structure;
a first dielectric structure;
a second dielectric structure, wherein the conductive structure is between a sidewall of the first dielectric structure and a sidewall of the second dielectric structure;
an etch stop layer overlying the conductive structure and between the sidewall of the first dielectric structure and the sidewall of the second dielectric structure;
a spacer structure overlying the first dielectric structure; and
a third dielectric structure overlying the spacer structure and the etch stop layer.

14. The semiconductor device of claim 13, comprising a second conductive structure overlying the spacer structure and the conductive structure.

15. The semiconductor device of claim 13, comprising a second conductive structure, wherein the spacer structure, the first dielectric structure, and the third dielectric structure are in contact with the second conductive structure.

16. A semiconductor structure, comprising:
a first conductive structure;
a first dielectric structure laterally coincident with the first conductive structure, wherein a top surface of the first dielectric structure is above a top surface of the first conductive structure;
a first spacer structure overlying the first dielectric structure; and
a conductive material overlying the first conductive structure and laterally coincident with the first dielectric structure and the first spacer structure, wherein the conductive material contacts a sidewall of the first spacer structure and a sidewall of the first dielectric structure.

17. The semiconductor structure of claim 16, wherein the conductive material contacts the top surface of the first conductive structure.

18. The semiconductor structure of claim 16, comprising:
a second conductive structure, wherein the first dielectric structure is laterally between the first conductive structure and the second conductive structure; and
an etch stop layer structure overlying the second conductive structure, wherein the first dielectric structure is laterally between the conductive material and the etch stop layer structure.

19. The semiconductor structure of claim 18, comprising:
a second dielectric structure overlying the etch stop layer structure, wherein the first dielectric structure is laterally between the conductive material and the second dielectric structure.

20. The semiconductor structure of claim 16, comprising:
a second dielectric structure, wherein:
the first spacer structure is between the conductive material and the second dielectric structure, and
the second dielectric structure overlies the first spacer structure.

* * * * *